(12) United States Patent
Ohsaki

(10) Patent No.: US 10,199,326 B1
(45) Date of Patent: Feb. 5, 2019

(54) THREE-DIMENSIONAL MEMORY DEVICE WITH DRIVER CIRCUITRY ON THE BACKSIDE OF A SUBSTRATE AND METHOD OF MAKING THEREOF

(71) Applicant: SANDISK TECHNOLOGIES LLC, Plano, TX (US)

(72) Inventor: Shingo Ohsaki, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 15/726,143

(22) Filed: Oct. 5, 2017

(51) Int. Cl.
| | |
|---|---|
| H01L 27/115 | (2017.01) |
| H01L 23/522 | (2006.01) |
| H01L 27/11524 | (2017.01) |
| H01L 27/11519 | (2017.01) |
| H01L 27/11556 | (2017.01) |
| H01L 21/768 | (2006.01) |
| H01L 27/11565 | (2017.01) |
| H01L 27/11582 | (2017.01) |
| H01L 23/48 | (2006.01) |
| H01L 27/1157 | (2017.01) |

(Continued)

(52) U.S. Cl.
CPC .... *H01L 23/5226* (2013.01); *H01L 21/76877* (2013.01); *H01L 21/76898* (2013.01); *H01L 23/481* (2013.01); *H01L 27/1157* (2013.01); *H01L 27/1158* (2013.01); *H01L 27/11519* (2013.01); *H01L 27/11524* (2013.01); *H01L 27/11551* (2013.01); *H01L 27/11553* (2013.01); *H01L 27/11556* (2013.01); *H01L 27/11563* (2013.01); *H01L 27/11565* (2013.01); *H01L 27/11568* (2013.01); *H01L 27/11573* (2013.01); *H01L 27/11575* (2013.01); *H01L 27/11578* (2013.01); *H01L 27/11582* (2013.01)

(58) Field of Classification Search
None
See application file for complete search history.

(56) References Cited

U.S. PATENT DOCUMENTS

| 5,915,167 A | 6/1999 | Leedy |
| 9,343,358 B1 | 5/2016 | Xu |

(Continued)

OTHER PUBLICATIONS

U.S. Appl. No. 15/638,672, filed Jun. 30, 2017, SanDisk Technologies LLC.

(Continued)

*Primary Examiner* — Minh-Loan Tran
(74) *Attorney, Agent, or Firm* — The Marbury Law Group PLLC

(57) ABSTRACT

A three-dimensional memory device includes an alternating stack of insulating layers and word lines located over a front side surface of a semiconductor substrate, memory stack structures extending through the alternating stack, in which each of the memory stack structures includes a memory film and a vertical semiconductor channel contacting an inner sidewall of the memory film, drain regions contacting a respective vertical semiconductor channel, bit lines electrically connected to the respective drain regions, driver circuitry for the memory stack structures located on a backside of the semiconductor substrate, and electrically conductive paths vertically extending through the semiconductor substrate and electrically connecting nodes of the driver circuitry to respective word lines or bit lines.

12 Claims, 26 Drawing Sheets

(51) Int. Cl.
*H01L 27/11563* (2017.01)
*H01L 27/11578* (2017.01)
*H01L 27/11568* (2017.01)
*H01L 27/11575* (2017.01)
*H01L 27/11551* (2017.01)
*H01L 27/11553* (2017.01)
*H01L 27/11573* (2017.01)
*H01L 27/1158* (2017.01)

(56) References Cited

U.S. PATENT DOCUMENTS

| | | | |
|---|---|---|---|
| 9,691,782 B1 * | 6/2017 | Hwang | H01L 27/11565 |
| 9,876,031 B1 * | 1/2018 | Shimizu | H01L 27/11582 |
| 9,972,640 B1 * | 5/2018 | Kai | H01L 27/11519 |
| 2016/0049423 A1 * | 2/2016 | Yoo | H01L 27/11582 |
| | | | 257/324 |

OTHER PUBLICATIONS

U.S. Appl. No. 15/605,204, filed May 25, 2017, SanDisk Technologies LLC.

* cited by examiner

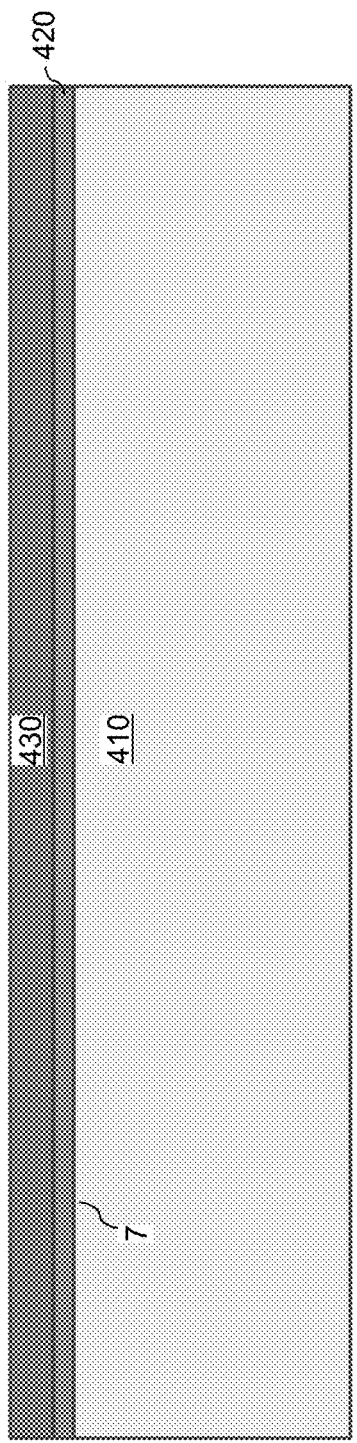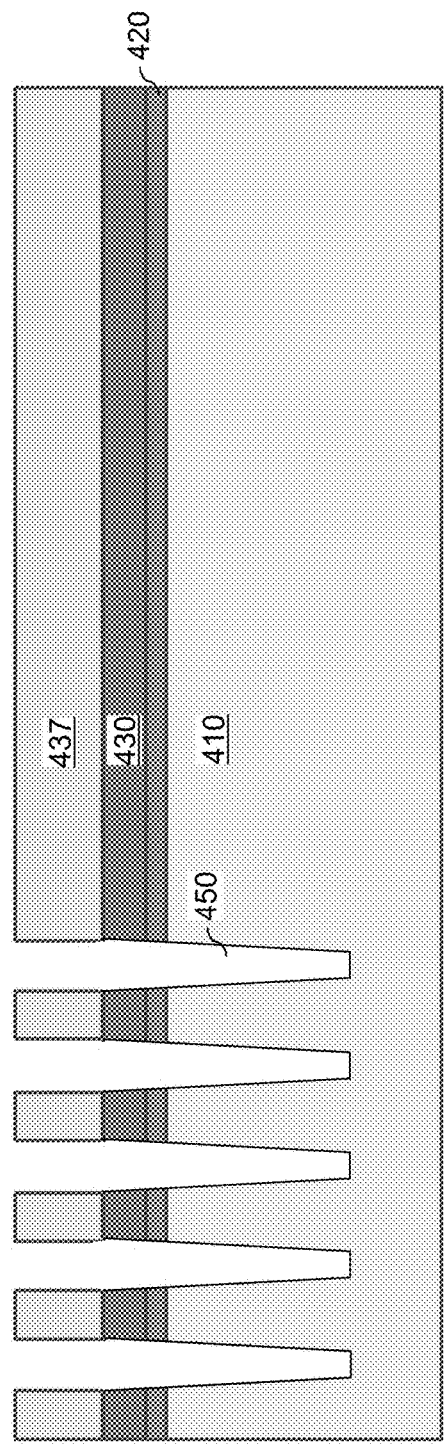

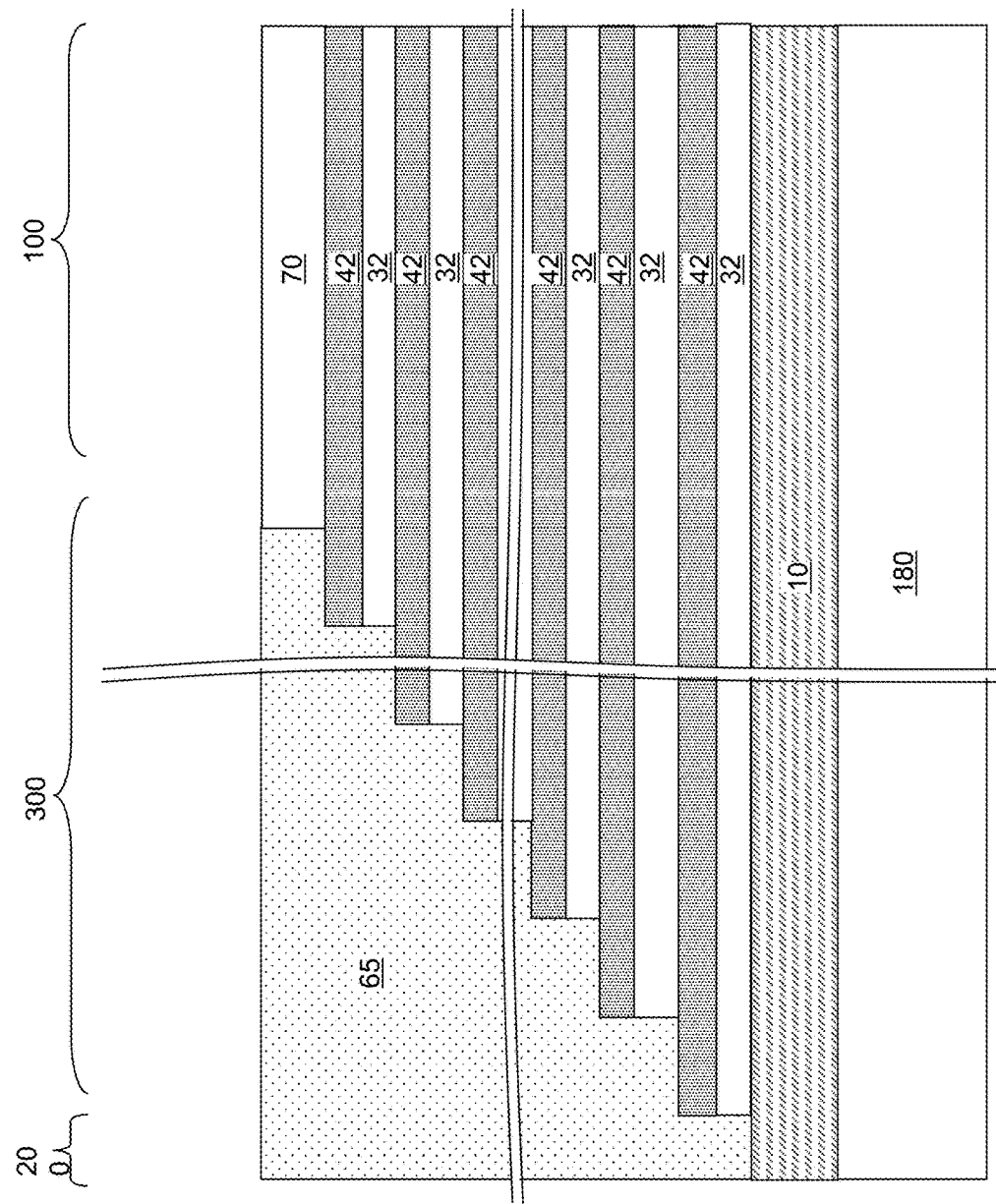

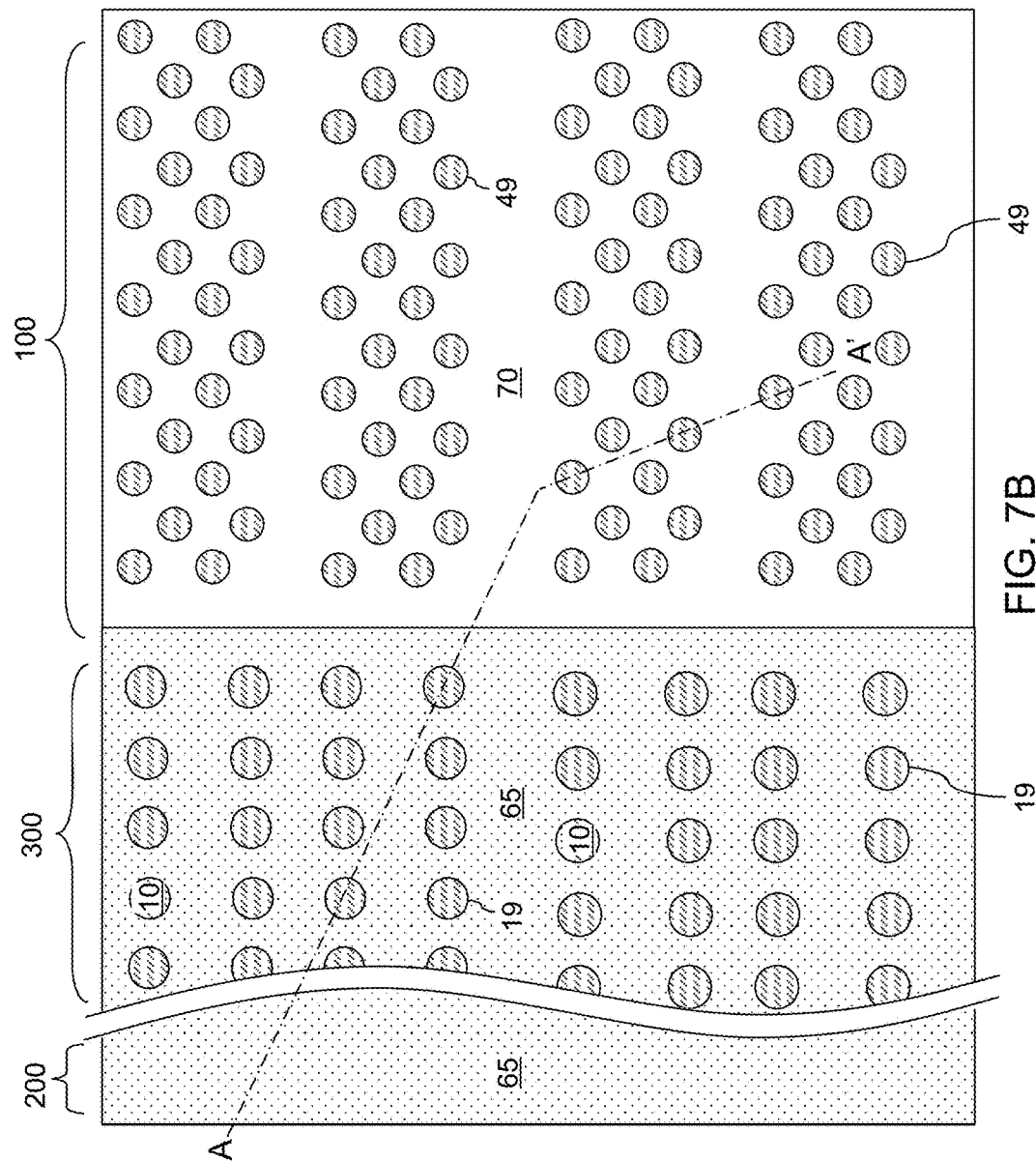

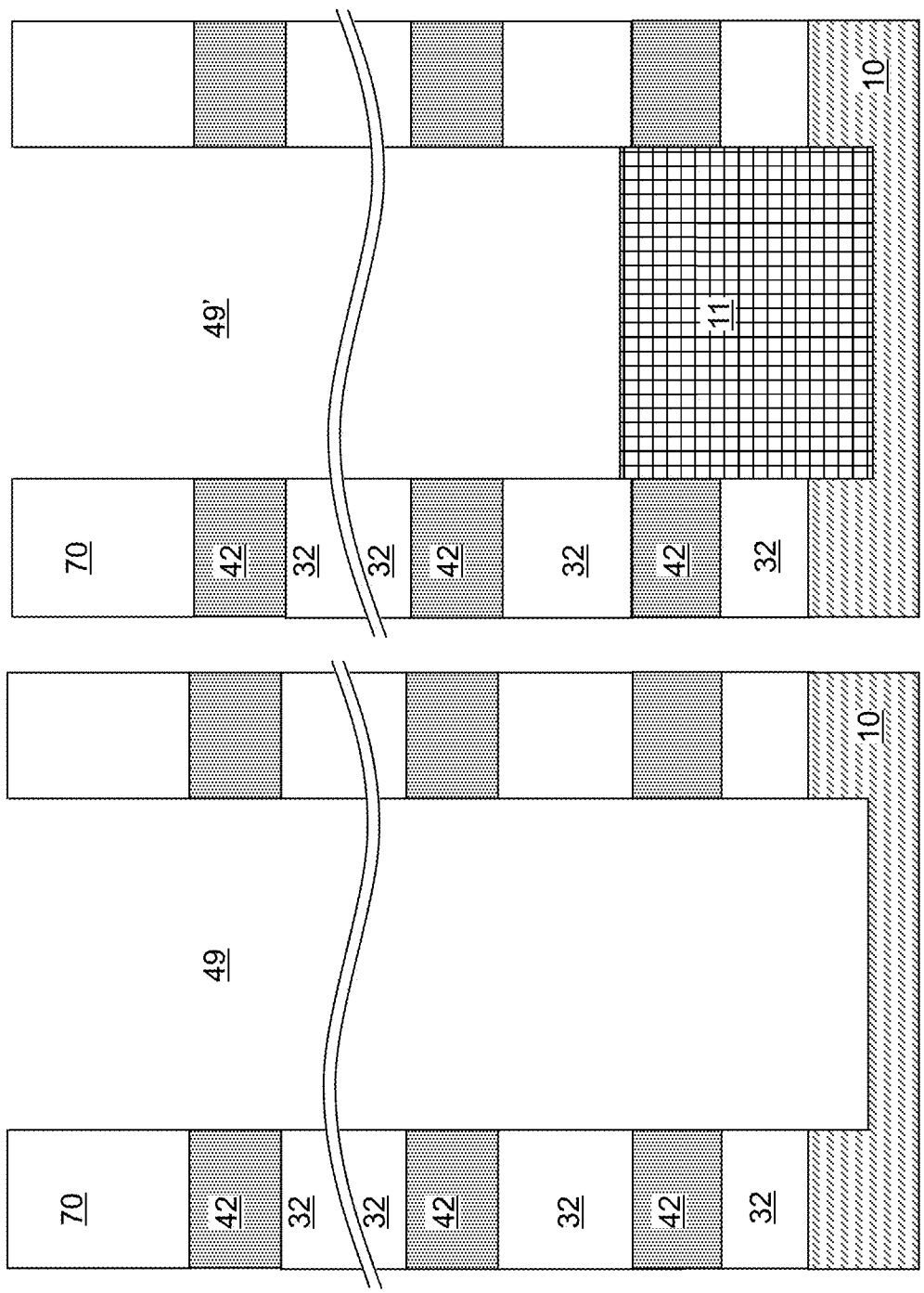

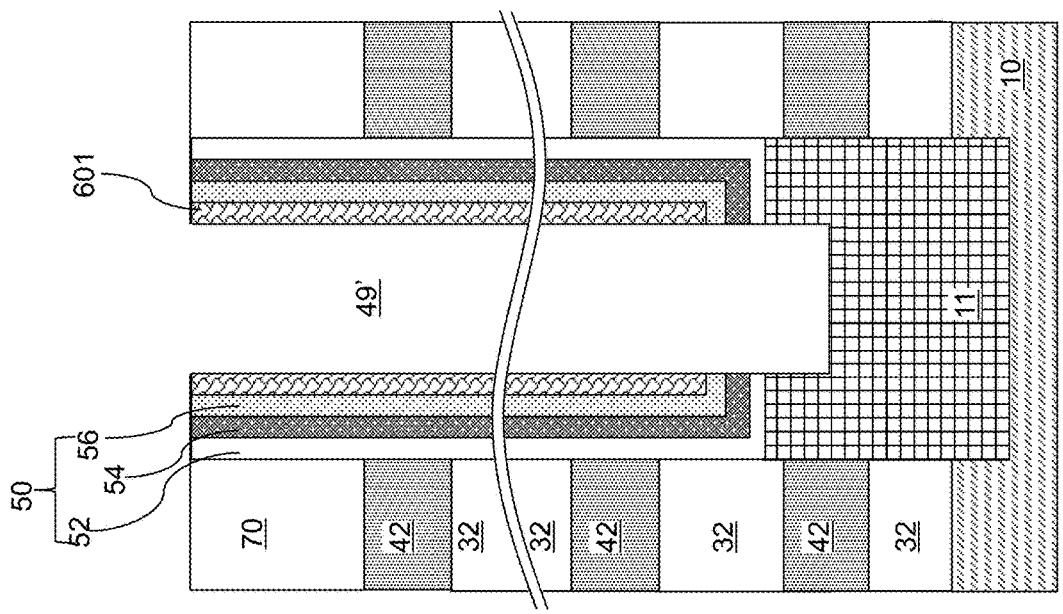
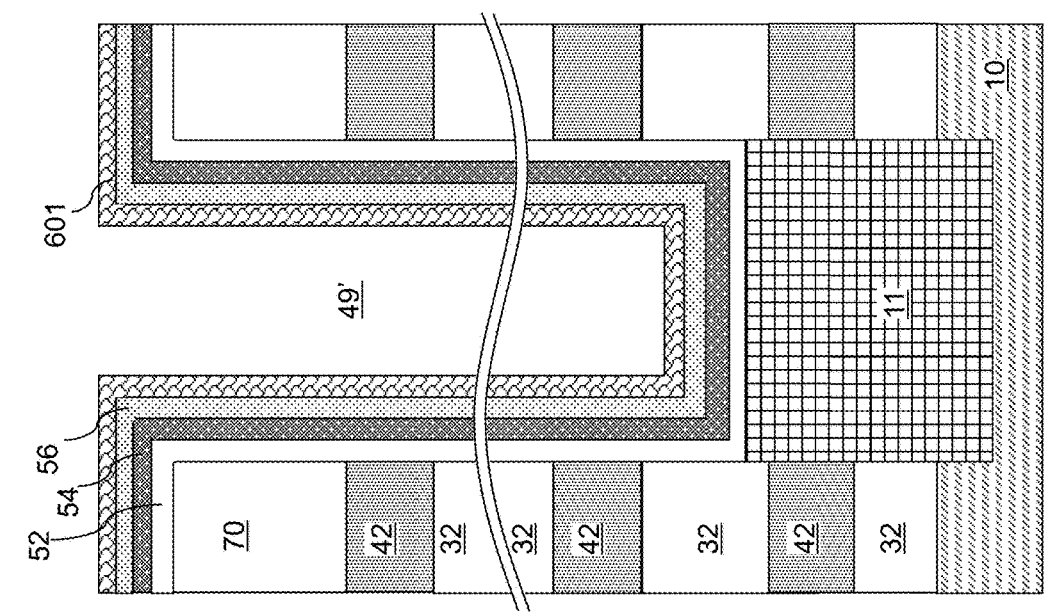

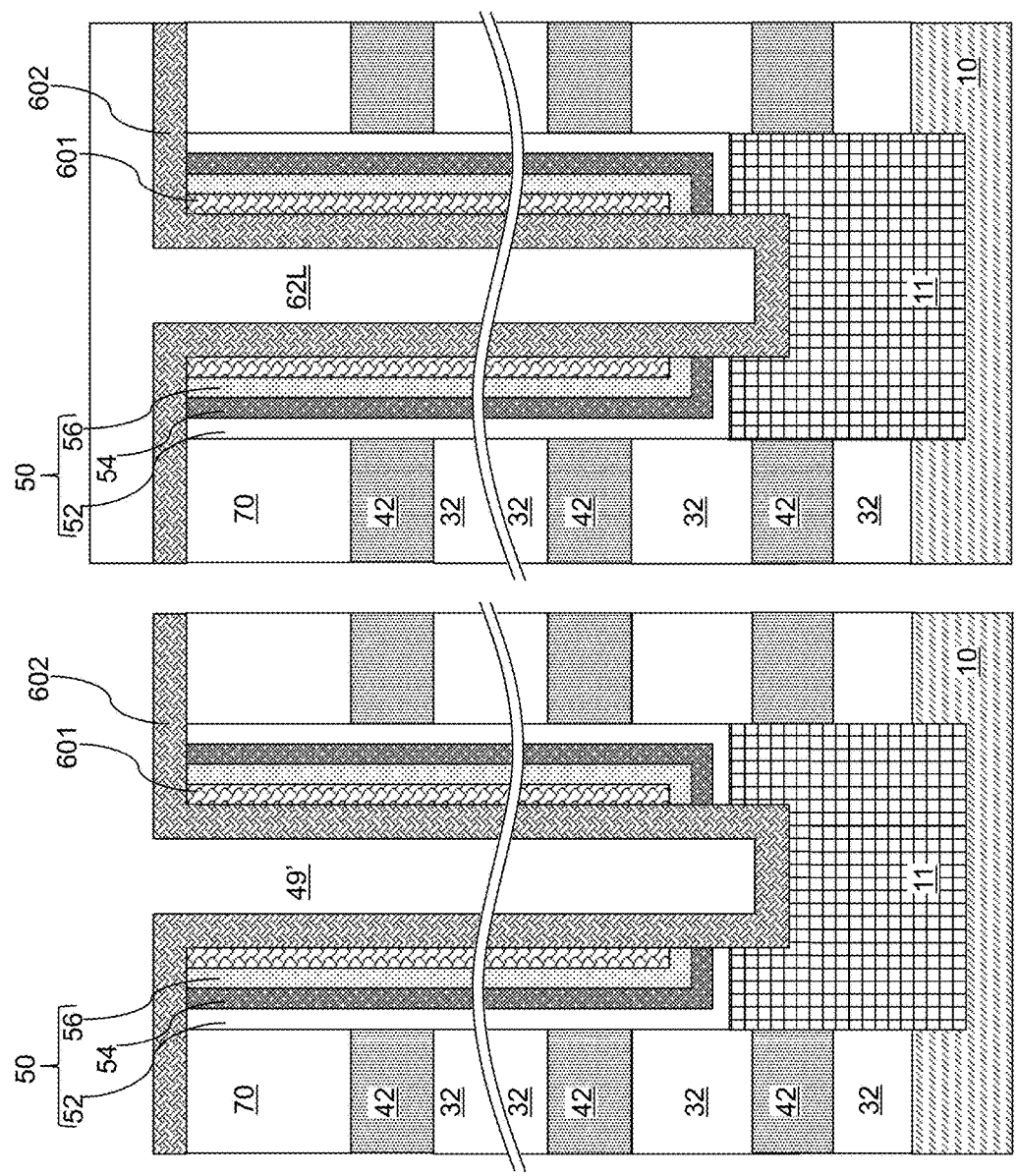

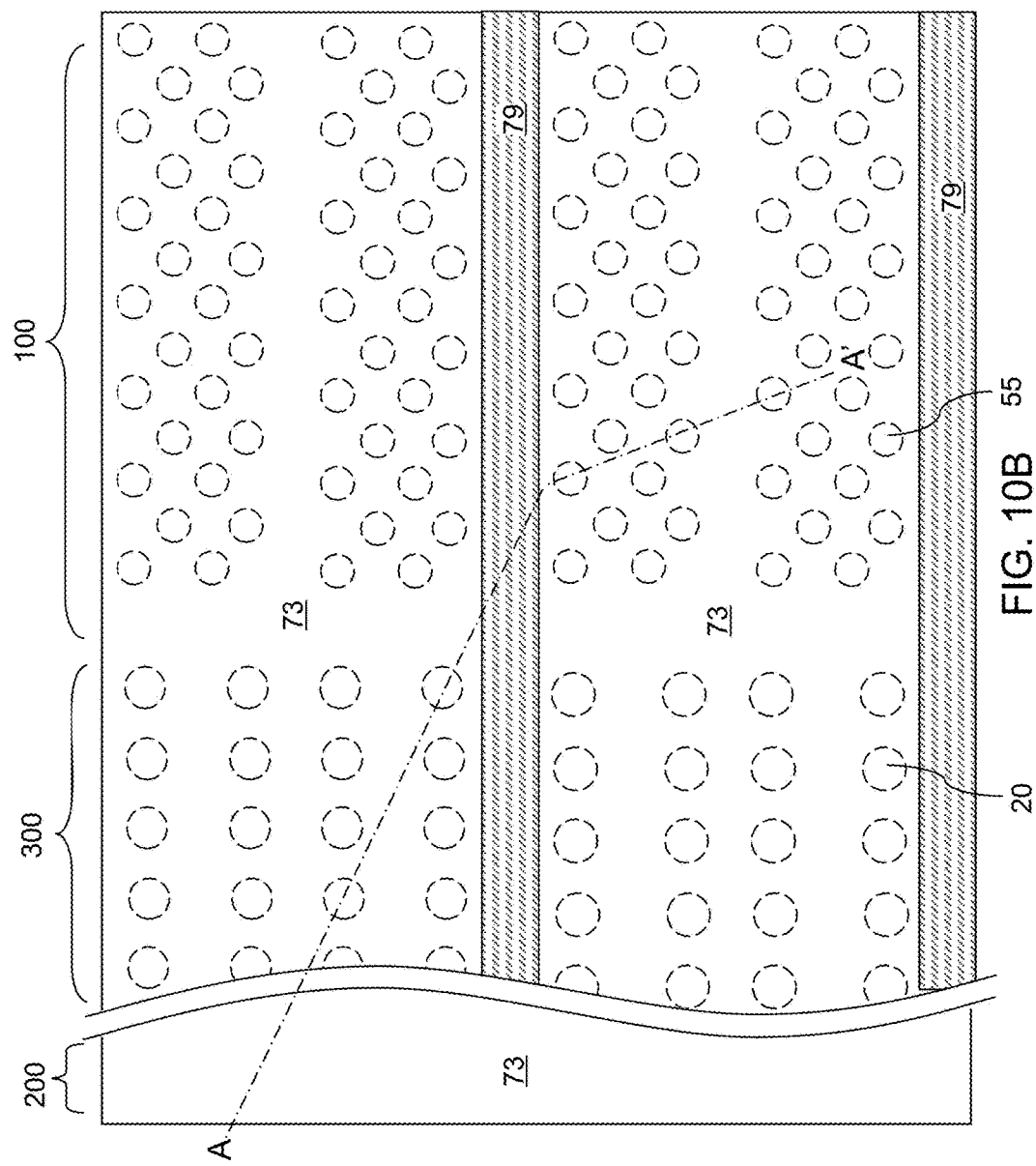

THREE-DIMENSIONAL MEMORY DEVICE WITH DRIVER CIRCUITRY ON THE BACKSIDE OF A SUBSTRATE AND METHOD OF MAKING THEREOF

FIELD

The present disclosure relates generally to the field of semiconductor devices, and particular to a three-dimensional memory device with a driver circuitry on the backside of a substrate and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and word lines located over a front side surface of a semiconductor substrate, memory stack structures extending through the alternating stack, in which each of the memory stack structures includes a memory film and a vertical semiconductor channel contacting an inner sidewall of the memory film, drain regions contacting a respective vertical semiconductor channel, bit lines electrically connected to the respective drain regions, driver circuitry for the memory stack structures located on a backside of the semiconductor substrate, and electrically conductive paths vertically extending through the semiconductor substrate and electrically connecting nodes of the driver circuitry to respective word lines or bit lines.

According to another aspect of the present disclosure, a method of forming a three-dimensional memory device includes forming through-substrate via structures through an upper portion of a semiconductor substrate, forming an alternating stack of insulating layers and spacer material layers over a front side surface of a semiconductor substrate, wherein the spacer material layers are formed as, or are subsequently replaced with word lines, forming memory stack structures through the alternating stack, wherein each of the memory stack structures comprises a memory film and a vertical semiconductor channel contacting an inner sidewall of the memory film, thinning the semiconductor substrate by removing a lower portion of the semiconductor substrate, such that bottom surfaces of the through-substrate via structures are physically exposed and a backside surface of the semiconductor substrate is provided after thinning the semiconductor substrate, and forming driver circuitry for the memory stack structures on the backside surface of the semiconductor substrate.

BRIEF DESCRIPTION OF THE DRAWINGS

FIG. 1 is a schematic vertical cross-sectional view of an exemplary structure after formation of a pad dielectric layer and a hard mask layer over a semiconductor substrate according to an embodiment of the present disclosure.

FIG. 2 is a schematic vertical cross-sectional view of an exemplary structure after application and patterning of a photoresist layer and formation of through-substrate via cavities by an anisotropic etch process according to an embodiment of the present disclosure.

FIG. 6B is a schematic vertical cross-sectional view of an upper portion of the exemplary structure of FIG. 6A.

FIG. 7B is a top-down view of the exemplary structure of FIG. 7A. The vertical plane A-A' is the plane of the cross-section for FIG. 7A.

FIGS. 8A-8H are sequential schematic vertical cross-sectional views of a memory opening within the exemplary structure up to the processing step of deposition of a second semiconductor channel layer according to an embodiment of the present disclosure.

FIG. 10B is a partial see-through top-down view of the exemplary structure of FIG. 10A. The vertical plane A-A' is the plane of the schematic vertical cross-sectional view of FIG. 10A.

DETAILED DESCRIPTION

Figure 3:
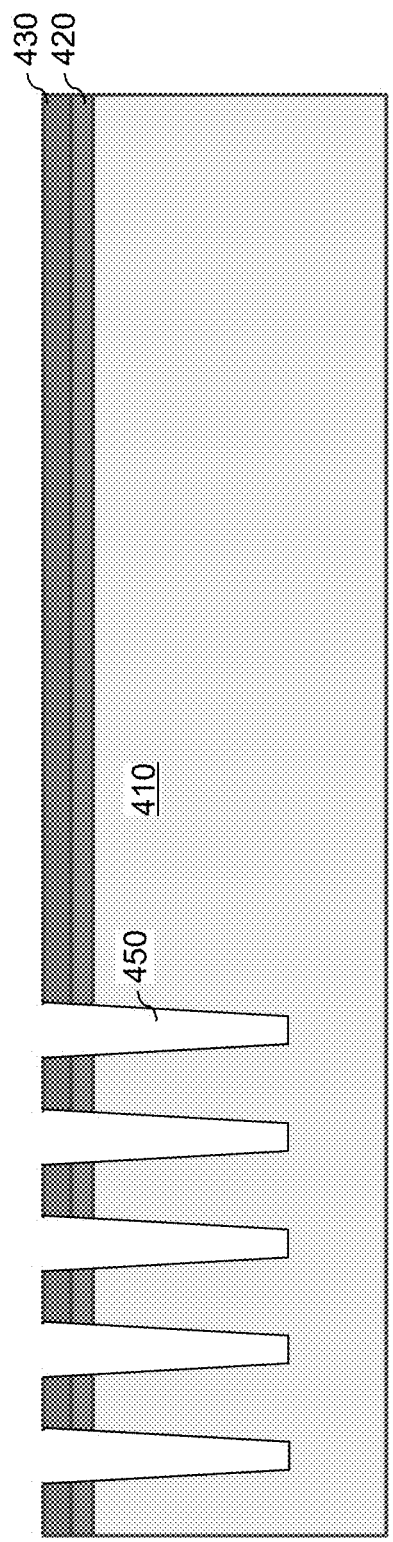
FIG. 3 is a schematic vertical cross-sectional view of an exemplary structure after removal of the hard mask layer and the pad dielectric layer according to an embodiment of the present disclosure.

As three-dimensional memory devices scale to smaller device dimensions, the device area for peripheral devices can take up a significant portion of the total chip area. CMOS under array architecture has been proposed to stack a three-dimensional array of memory devices over underlying peripheral CMOS transistors of the driver circuitry on a substrate. Hydrogen originating from various components of the three-dimensional array (such an alternating stack of hydrogen containing silicon oxide and silicon nitride layers) can diffuse to the transistors during the high temperature annealing of the device and deleteriously affect the device performance (e.g., increase in leakage current during the off-state) of the peripheral devices underlying the three-dimensional array of memory devices. Thus, embodiments of the present disclosure provide a structure and a method for blocking diffusion of hydrogen between the three-dimensional array of memory devices and the peripheral devices of the driver circuitry. One embodiment of the present disclosure is directed to a three-dimensional memory device with a driver circuitry on the backside of a substrate and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include be a single memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a semiconductor substrate 410. The semiconductor substrate 410 maybe a commercially available semiconductor wafer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the semiconductor substrate 410. The major surface 7 can be a semiconductor surface. In one embodiment, the semiconductor substrate 410 comprises, and may consist of, a single crystalline semiconductor substrate, and the major surface 7 can be a single crystalline semiconductor surface, such as a single crystalline semiconductor surface. In one embodiment, the semiconductor substrate 410 can be a commercially available single crystalline silicon wafer.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A pad dielectric layer 420 and a hard mask layer 430 can be formed over the semiconductor substrate 410. The pad dielectric layer 420 includes a dielectric material for promoting adhesion of the hard mask layer 430. For example, the pad dielectric layer 420 can be a silicon oxide layer, which can be formed by thermal or plasma oxidation of the top surface portion of the semiconductor substrate 410. The thickness of the pad dielectric layer 420 can be in a range from 1 nm to 30 nm, such as from 3 nm to 10 nm, although lesser and greater thicknesses can also be employed.

The hard mask layer 430 includes a material that can be employed as a stopping material during a subsequent planarization process. For example, the hard mask layer 430 can include a silicon nitride layer having a thickness in a range from 10 nm to 200 nm, such as from 20 nm to 100 nm, although lesser and greater thicknesses can also be employed.

Referring to FIG. 2, a photoresist layer 437 is applied over the hard mask layer 430, and is lithographically patterned to form openings therethrough. The openings in the photoresist layer 437 are located within areas in which through-substrate via structures are to be subsequently formed to provide vertical electrical connections that pass through an upper portion of the semiconductor substrate 410. In one embodiment, the openings in the photoresist layer 437 can be located within a through-substrate via region in which an array of through-substrate via structures is to be subsequently formed.

An anisotropic etch can be performed to etch through unmasked portions of the hard mask layer 430, the dielectric pad layer 420, and an upper portion of the semiconductor substrate 410. Through-substrate via cavities 450 are formed though the upper portion of the semiconductor substrate 410 and part of the way through the thickness of the semiconductor substrate 410. The depth of the through-substrate via cavities 450 in the upper portion of the semiconductor substrate 410, as measured between a horizontal plane including the front side surface (i.e., the top surface 7) of the semiconductor substrate 410 to the bottom surface of each through-substrate via cavity 450, can be greater than the target thickness of a thinned semiconductor substrate to be subsequently formed by thinning the semiconductor substrate 410. For example, the depth of the through-substrate via cavities 450 may be in a range from 20 microns to 400 microns, from 30 microns to 200 microns, and/or from 50 microns to 100 microns, although lesser and greater depths can also be employed. The maximum lateral dimension (such as the diameter, the major axis, or the diagonal of a rectangular shape) of the horizontal cross-sectional shape of each through-substrate via cavity 450 may be in a range from 0.5 micron to 30 microns, from 1 micron to 15 microns, and/or 2 microns to 8 microns, although lesser and greater maximum lateral dimensions can also be employed. The photoresist layer 437 may be consumed during the anisotropic etch or remove by ashing after the etching step. The patterned hard mask layer 430 can function as an etch mask layer during a latter portion of the anisotropic etch process. The patterned hard mask layer 430 can be thinned during the latter portion of the anisotropic etch process. FIG. 3 illustrates the exemplary structure at the end of the anisotropic etch process.

Figure 4A:
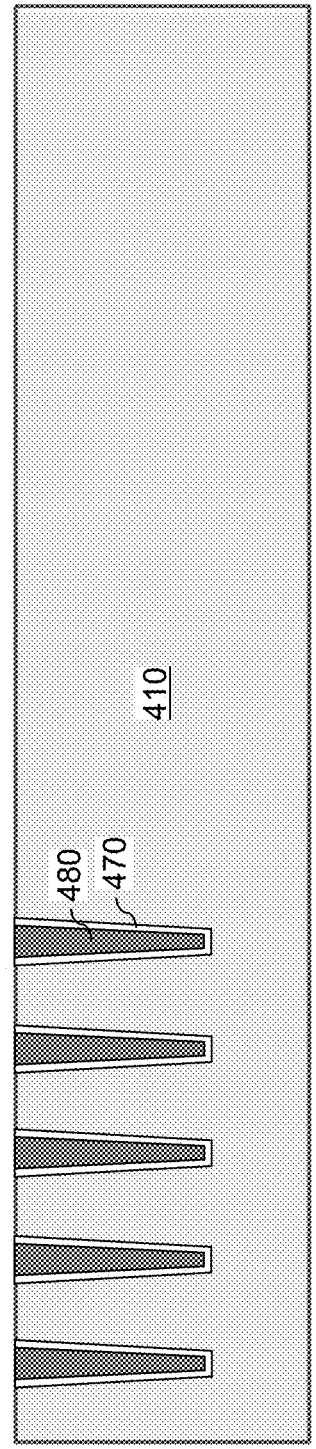
FIG. 4A is a schematic vertical cross-sectional view of an exemplary structure after formation of insulating liners and through-substrate via structures according to an embodiment of the present disclosure.
Figure 4B:
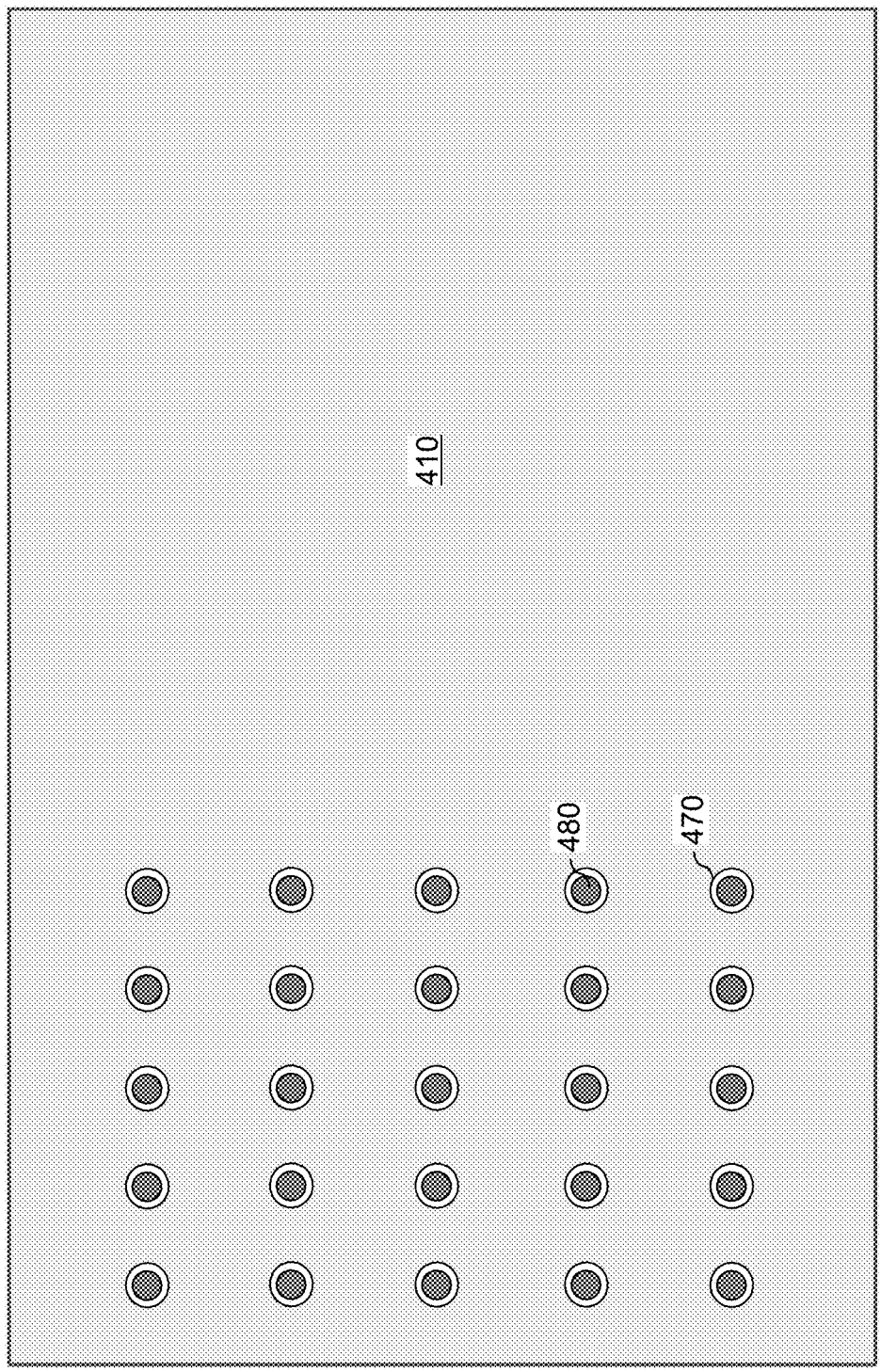
FIG. 4B is a top-down view of the exemplary structure of FIG. 4A.

Referring to FIGS. 4A and 4B, an optional insulating liner layer is conformally deposited on the sidewalls of the through-substrate via cavities 450 and over the semiconductor substrate 410, which can be over the top surface of the hard mask layer 430. The insulating liner layer includes at least one dielectric material such as silicon oxide and/or silicon nitride. The insulating liner layer may be omitted if the semiconductor substrate 410 is semi-insulating. The thickness of the insulating liner can be in a range from 30 nm to 600 nm, although lesser and greater thicknesses can also be employed. At least one conducive material can be deposited to fill the remaining volumes of the through-substrate via cavities 450. The at least one conductive material can include a conductive barrier layer, such as TiN or WN and a metal fill layer, such as tungsten, copper, aluminum, etc. A planarization process can be performed to remove portions of the at least one conductive material from above the horizontal plane including the top surfaces of the hard mask layer 430. The planarization process can employ chemical mechanical planarization and/or a recess etch. The horizontal portions of the insulating liner layer can be removed from above the top surface of the hard mask layer 430 during the planarization process.

Optionally, portions of the at least one conductive material located at the levels of the hard mask layer 430 and/or the dielectric pad layer 420 can be removed, for example, by a recess etch. The hard mask layer 430 and the dielectric pad layer 420 can be subsequently removed by isotropic etch processes, which can employ wet etch processes or CMP. Each remaining portion of the insulating liner layer in the through-substrate via cavities 450 constitutes an optional insulating liner 470. Each remaining portion of the at least one conductive material in the through-substrate via cavities 450 constitutes a through-substrate via structure 480. An array of through-substrate via structures 480 can be formed within a region of the exemplary structure, which is herein referred to as a through-substrate via region. The array of the through-substrate via structures 480 is formed through an upper portion of the semiconductor substrate 410.

Figure 5:
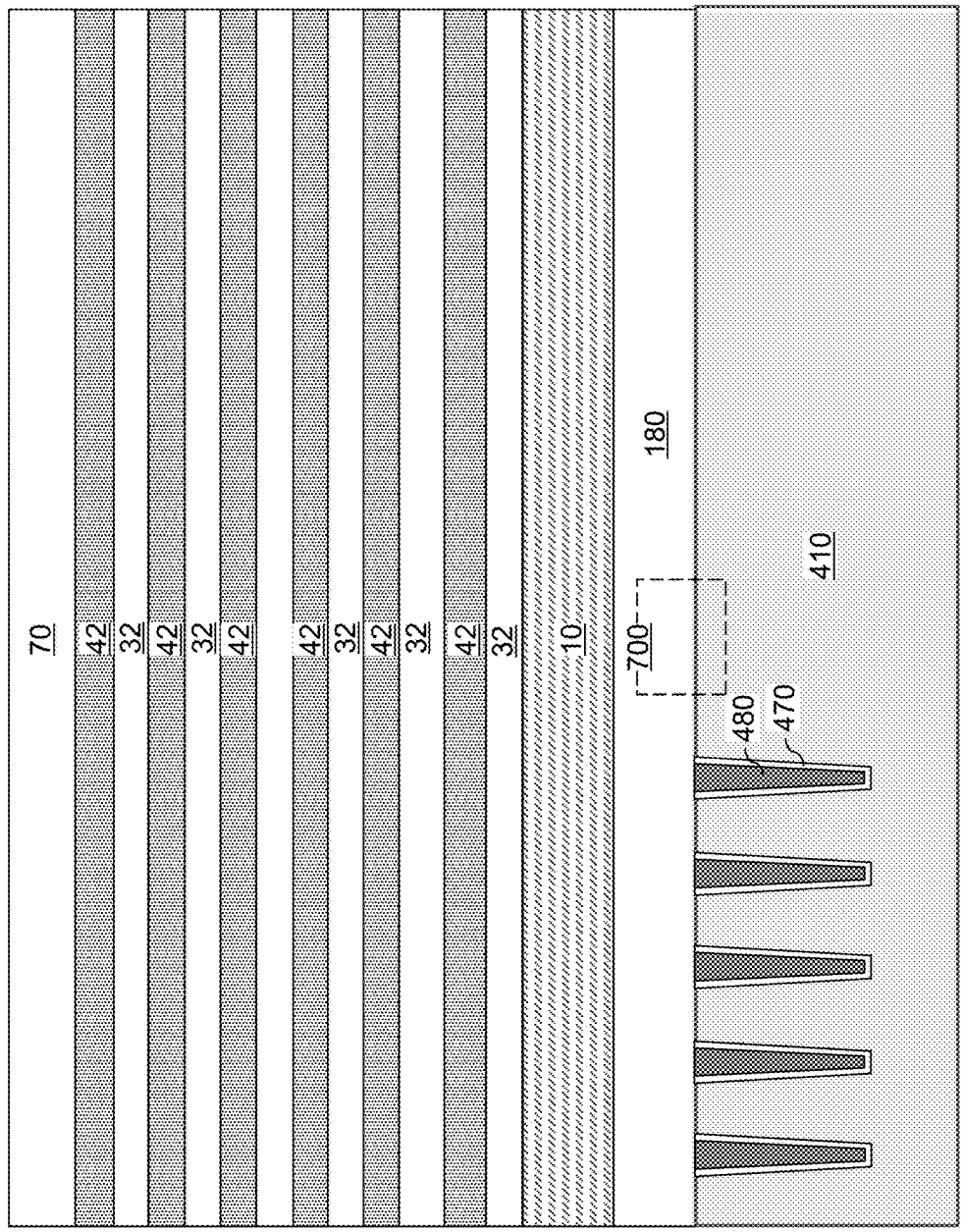
FIG. 5 is a schematic vertical cross-sectional view of an upper portion of the exemplary structure after formation of a dielectric spacer material layer, a planar semiconductor material layer, and an alternating stack of insulating layers and sacrificial material layers according to an embodiment of the present disclosure.

Referring to FIG. 5, optionally, semiconductor devices 700 such as field effect transistors can be optionally formed on the front side surface of the semiconductor substrate 410. Alternatively, there are no field effect transistors located on the front side surface of the semiconductor substrate 410. An optional dielectric spacer material layer 180 can be formed over the front side surface of the semiconductor substrate 410. The optional dielectric spacer material layer 180 includes a dielectric material such as silicon oxide. The thickness of the dielectric spacer material layer 180 can be in a range from 100 nm to 3,000 nm, although lesser and greater thicknesses can also be employed.

In case a dielectric spacer material layer 180 is provided, a planar semiconductor layer 10 can be formed over the dielectric spacer material layer 180. The planar semiconductor layer 10 includes a semiconductor material such as polycrystalline silicon, and can have a thickness in a range from 50 nm to 1,000 nm, although lesser and greater thicknesses can also be employed. The planar semiconductor layer 10 can be doped with electrical dopants of a first conductivity type, which can be p-type or n-type. The dopant concentration of the dopants of the first conductivity type in the planar semiconductor layer 10 can be in a range from $1.0 \times 10^{14}/cm^3$ to $1.0 \times 10^{18}/cm^3$, such as from $1.0 \times 10^{15}/cm^3$ to $1.0 \times 10^{17}/cm^3$, although lesser and greater concentrations can also be employed.

A stack of an alternating plurality of first material layers (which can be insulating layers 32) and second material layers (which can be sacrificial material layer 42) is formed over the front side surface of the planar semiconductor layer 10. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 6A:
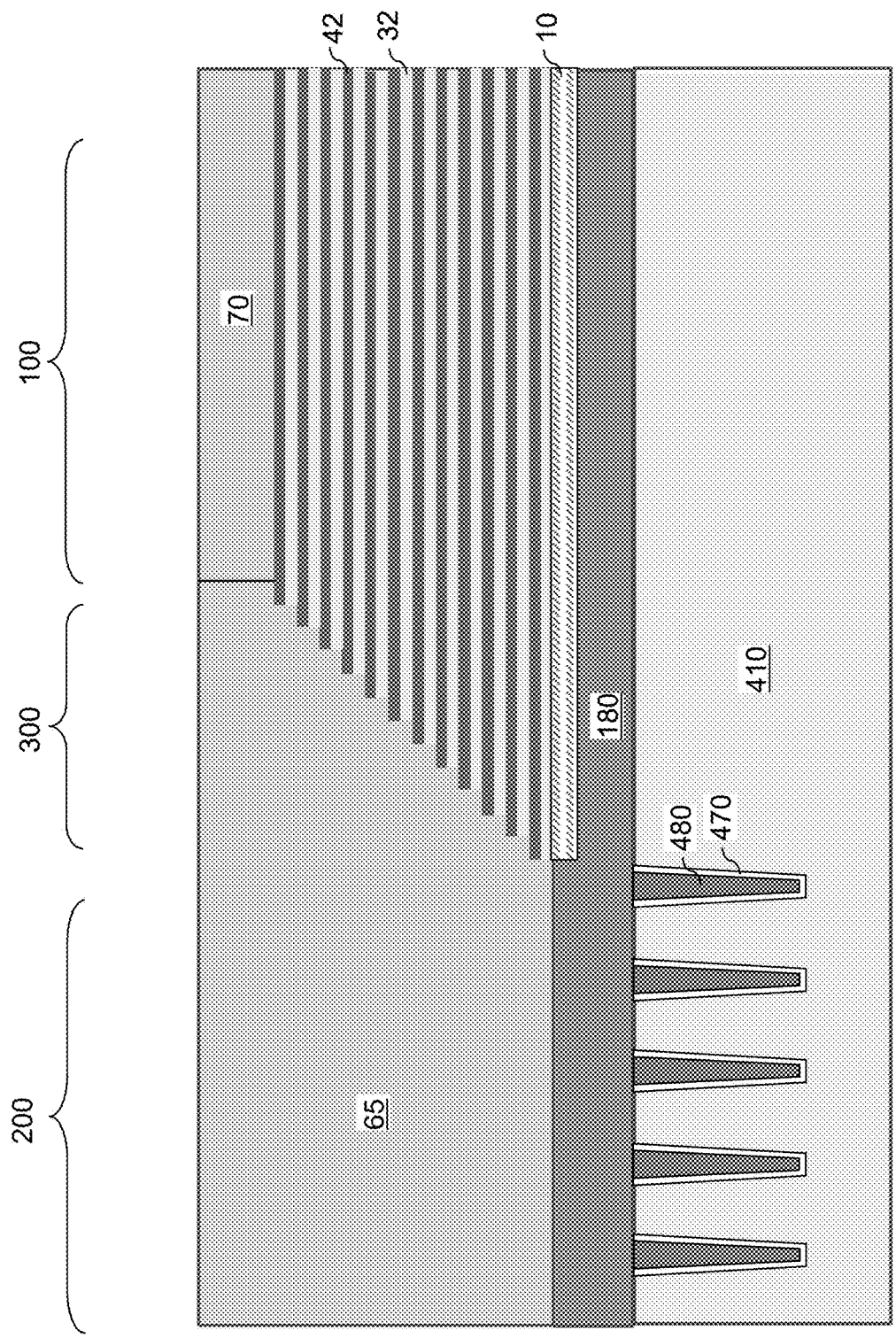
FIG. 6A is a schematic vertical cross-sectional view of the exemplary structure after formation of stepped terraces and a retro-stepped dielectric material portion according to an embodiment of the present disclosure.

Referring to FIGS. 6A and 6B, a stepped cavity can be formed within the contact region 300 which is located between the device region (e.g., memory array region) 100 and the peripheral connection region 200 containing connections to the peripheral driver circuitry. The stepped cavity can have various stepped surfaces such that the horizontal cross-sectional shape of the stepped cavity changes in steps as a function of the vertical distance from the front side surface of the semiconductor substrate 410. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure. The lateral extent of the spacer material layers (e.g., the sacrificial material layers 42) decreases with a vertical distance from the front side surface of the semiconductor substrate 410 after formation of the stepped surfaces.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 7A:
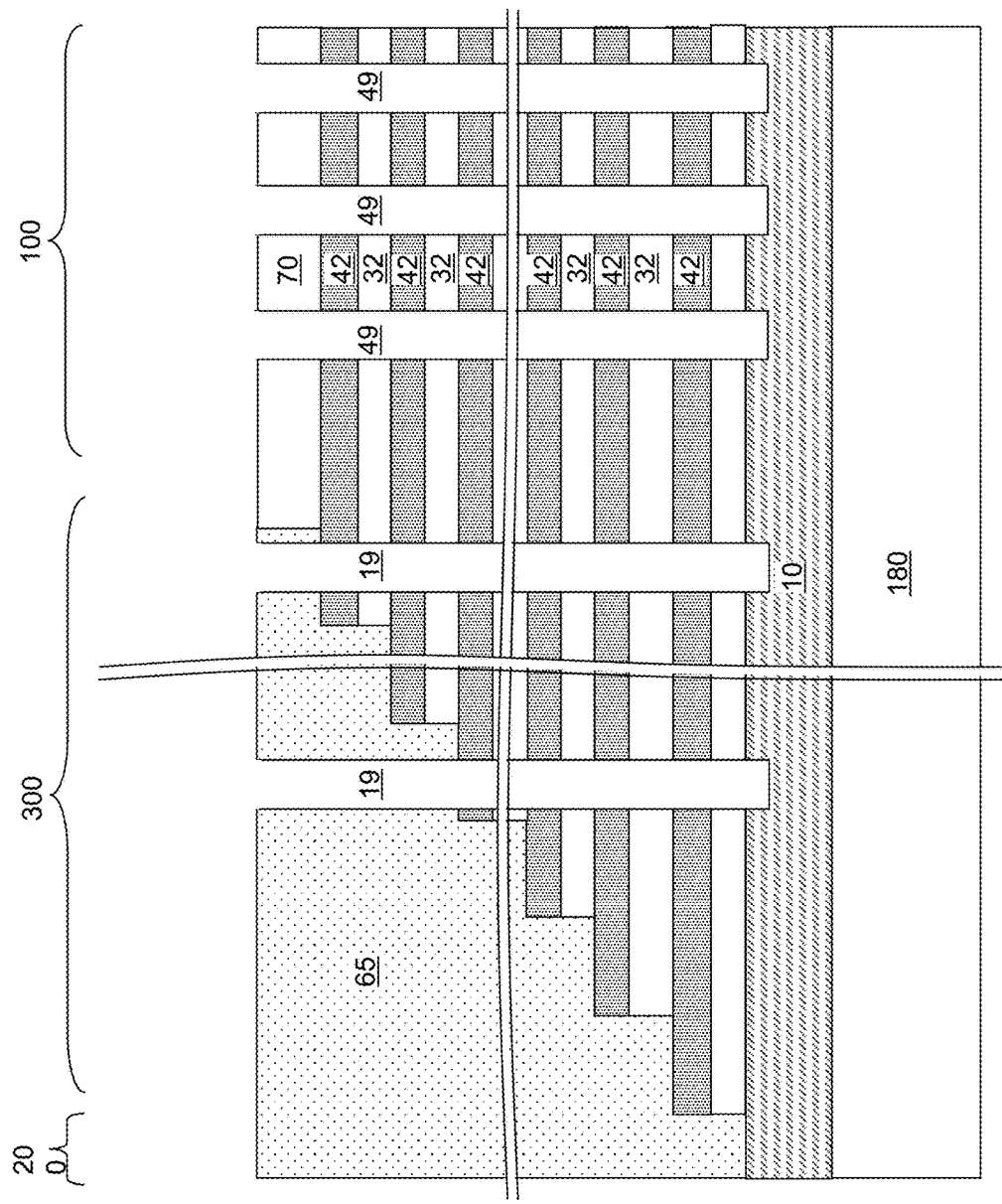
FIG. 7A is a schematic vertical cross-sectional view of the exemplary structure after formation of memory openings and support openings according to an embodiment of the present disclosure.

Referring to FIGS. 7A and 7B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the planar semiconductor layer 10. In one embodiment, an overetch into the planar semiconductor layer 10 may be optionally performed after the top surface of the planar semiconductor layer 10 is physically exposed at a bottom of each memory opening 49 and each support opening 19. The overetch may be performed prior to, or after, removal of the lithographic material stack. In other words, the recessed surfaces of the planar semiconductor layer 10 may be vertically offset from the un-recessed top surfaces of the planar semiconductor layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the planar semiconductor layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. Alternatively, the planar semiconductor layer 10 may be omitted, and the memory openings 49 and the support openings 19 can be extend to a top surface of the semiconductor substrate 410 if the semiconductor substrate 410 is a doped semiconductor substrate and the dielectric spacer layer 180 is omitted.

FIGS. 8A-8H illustrate structural changes in a memory opening 49, which is one of the memory openings 49 in the exemplary structure of FIGS. 7A and 7B. The same structural change occurs simultaneously in each of the other memory openings 49 and in each support opening 19.

Referring to FIG. 8A, a memory opening 49 in the exemplary device structure of FIGS. 7A and 7B is illustrated. The memory opening 49 extends through the insulating cap layer 70, the alternating stack (32, 42), the gate dielectric layer 12, and optionally into an upper portion of the planar semiconductor layer 10. At this processing step, each support opening 19 can extend through the retro-stepped dielectric material portion 65, a subset of layers in the alternating stack (32, 42), the gate dielectric layer 12, and optionally through the upper portion of the planar semiconductor layer 10. The recess depth of the bottom surface of each memory opening with respect to the top surface of the planar semiconductor layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 8B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the planar semiconductor layer 10. In one embodiment, the pedestal channel portion 11 can be doped with electrical dopants of the same conductivity type as the planar semiconductor layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the semiconductor substrate 410 and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the planar semiconductor layer 10 that the pedestal channel portion contacts. If a planar semiconductor layer 10 is not present, the pedestal channel portion 11 can be formed directly on the semiconductor substrate 410 if the semiconductor substrate 410 is a doped semiconductor substrate having the doping of the first conductivity type, and the dielectric spacer layer 180 is omitted.

Referring to FIG. 8C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 8D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the planar semiconductor layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor substrate layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 8E, a second semiconductor channel layer 602 can be deposited directly on the semiconductor surface of the pedestal channel portion 11 or the semiconductor substrate layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 8F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 8G:
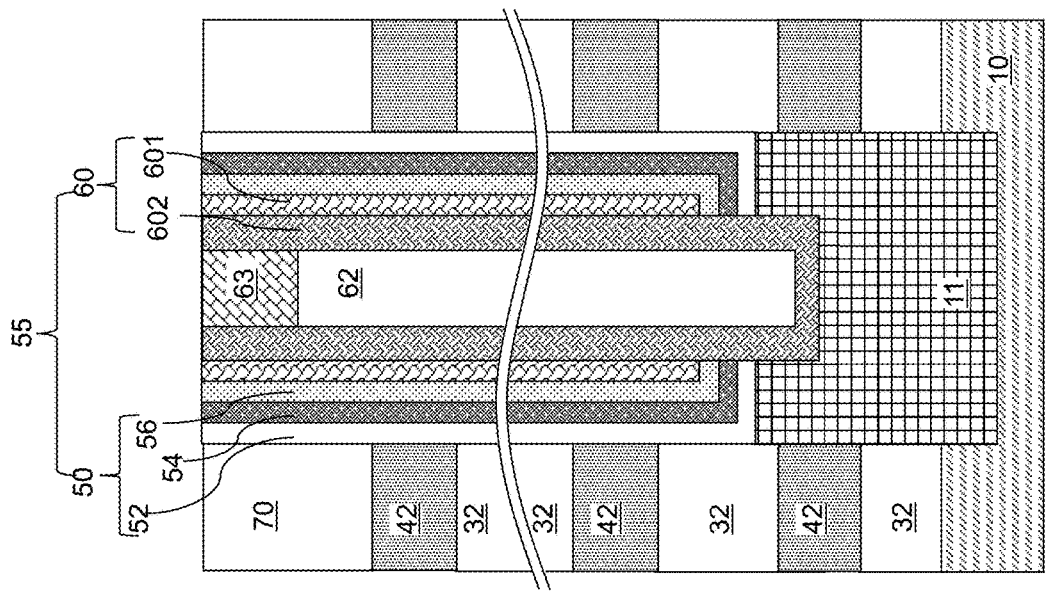

Referring to FIG. 8G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 8H:
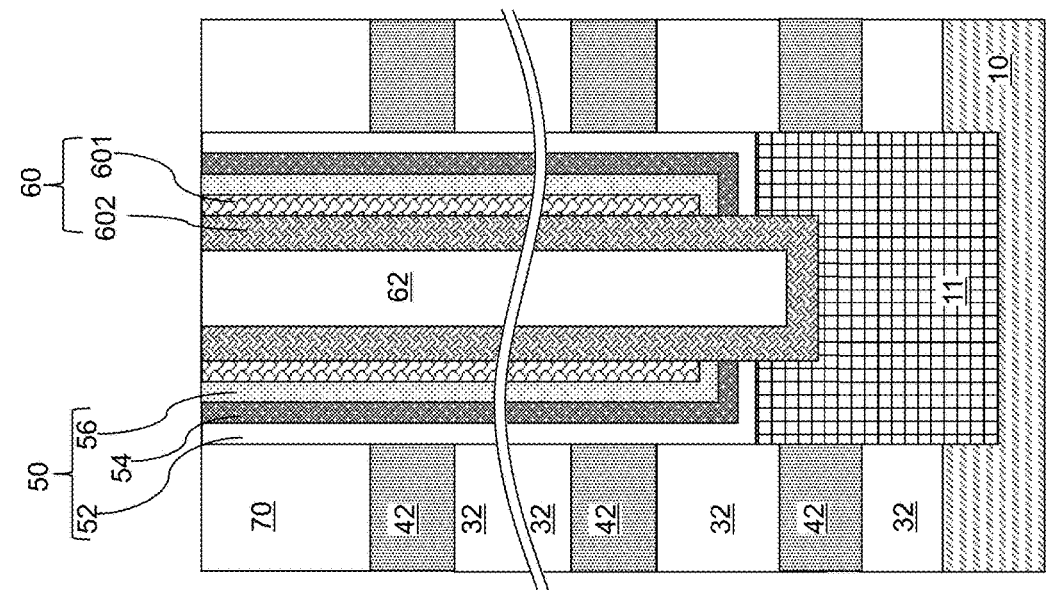

Referring to FIG. 8H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52.

Figure 9:
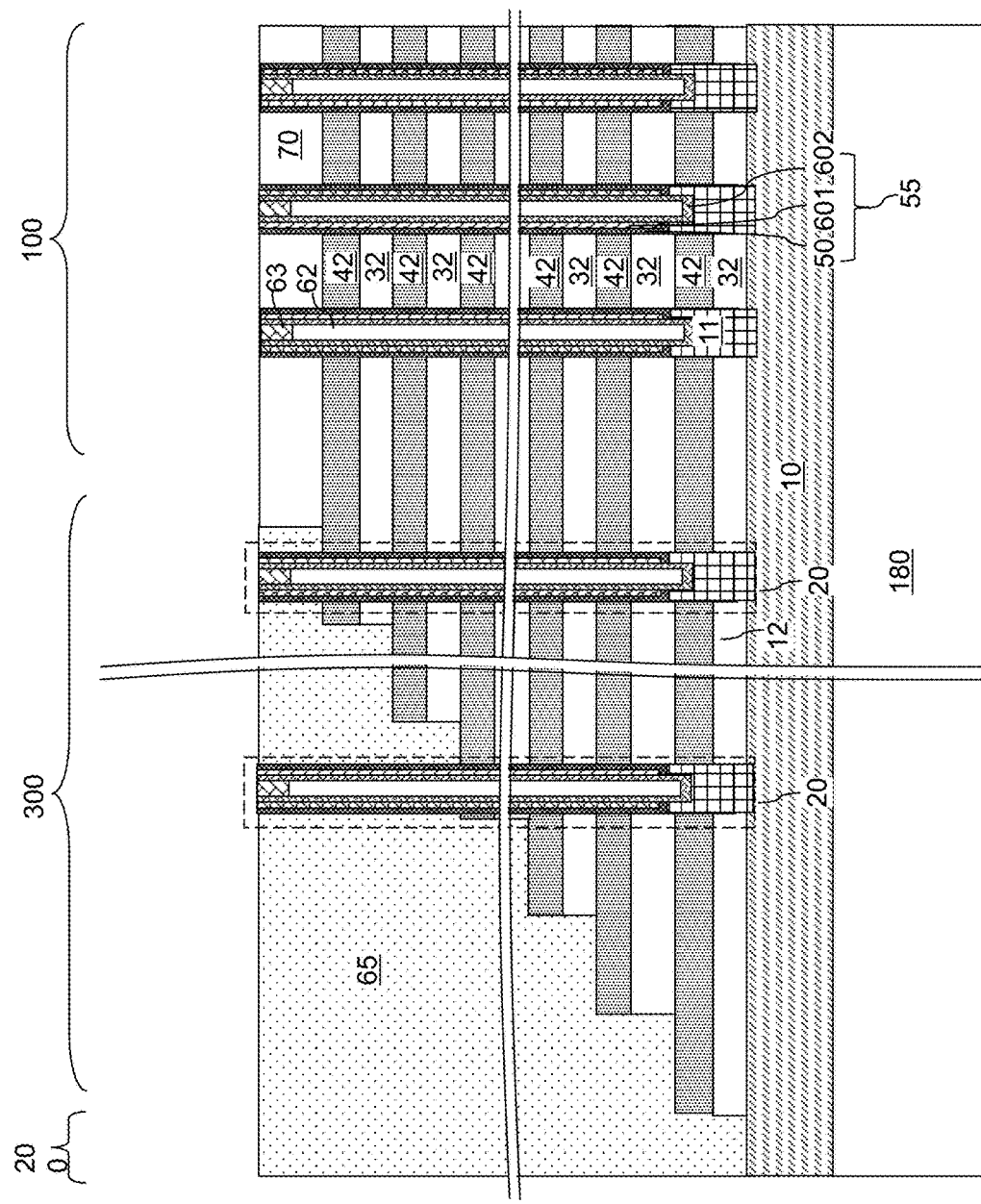
FIG. 9 is a schematic vertical cross-sectional view of the exemplary structure after formation of memory stack structures and support pillar structures according to an embodiment of the present disclosure.

Referring to FIG. 9, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 7A and 7B. An instance of the support pillar structure 20 can be formed within each support opening 19 of the structure of FIGS. 7A and 7B. Each combination of a pedestal channel portion 11 (if present), a memory stack structure 55, a dielectric core 62, and a drain region 63 that is formed within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 that is formed within each support opening 19 fills the respective support openings 19, and constitutes a support pillar structure 20.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 10A:
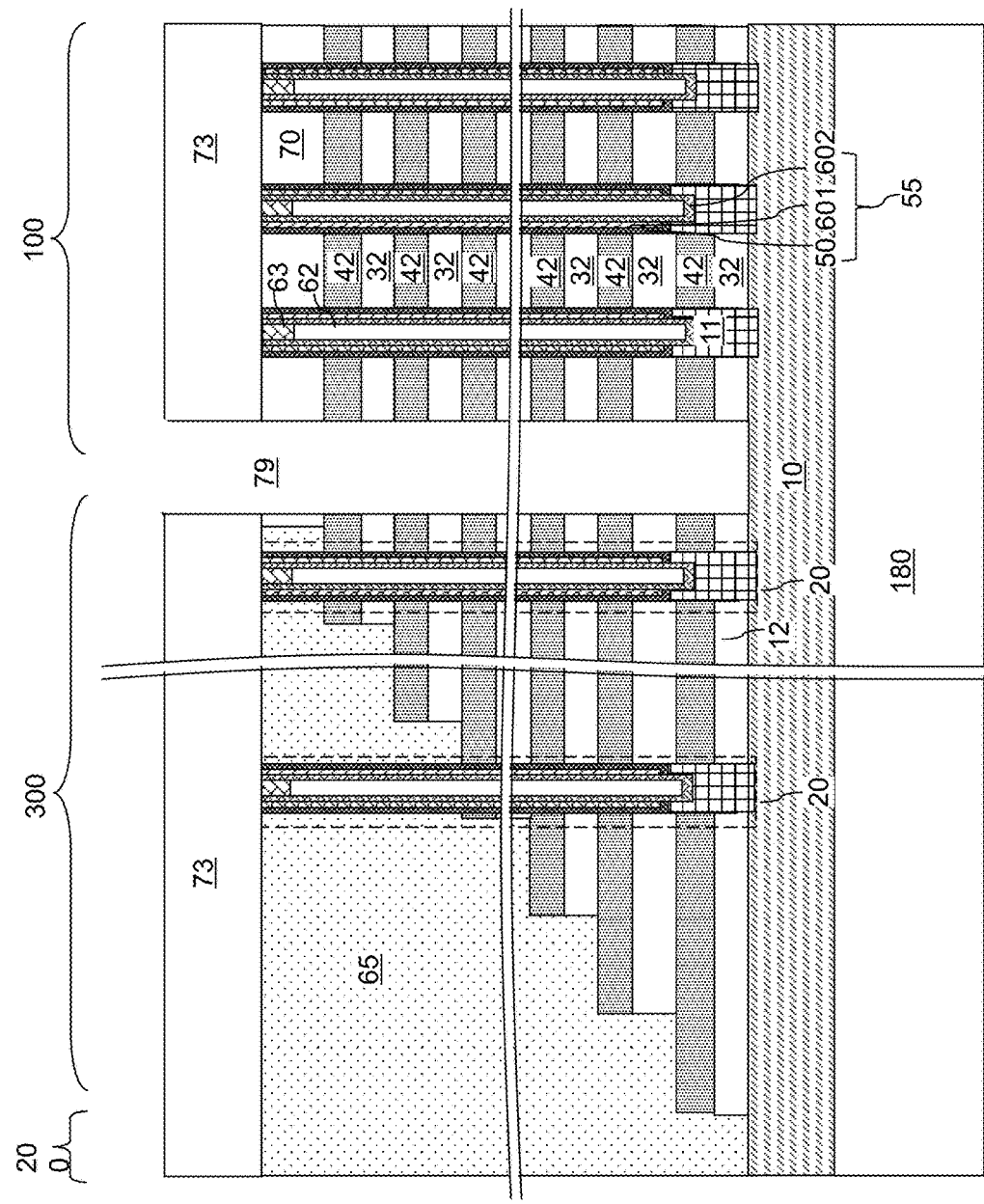
FIG. 10A is a schematic vertical cross-sectional view of the exemplary structure after formation of a backside trench according to an embodiment of the present disclosure.

Referring to FIGS. 10A and 10B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the semiconductor substrate 410, and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 11:
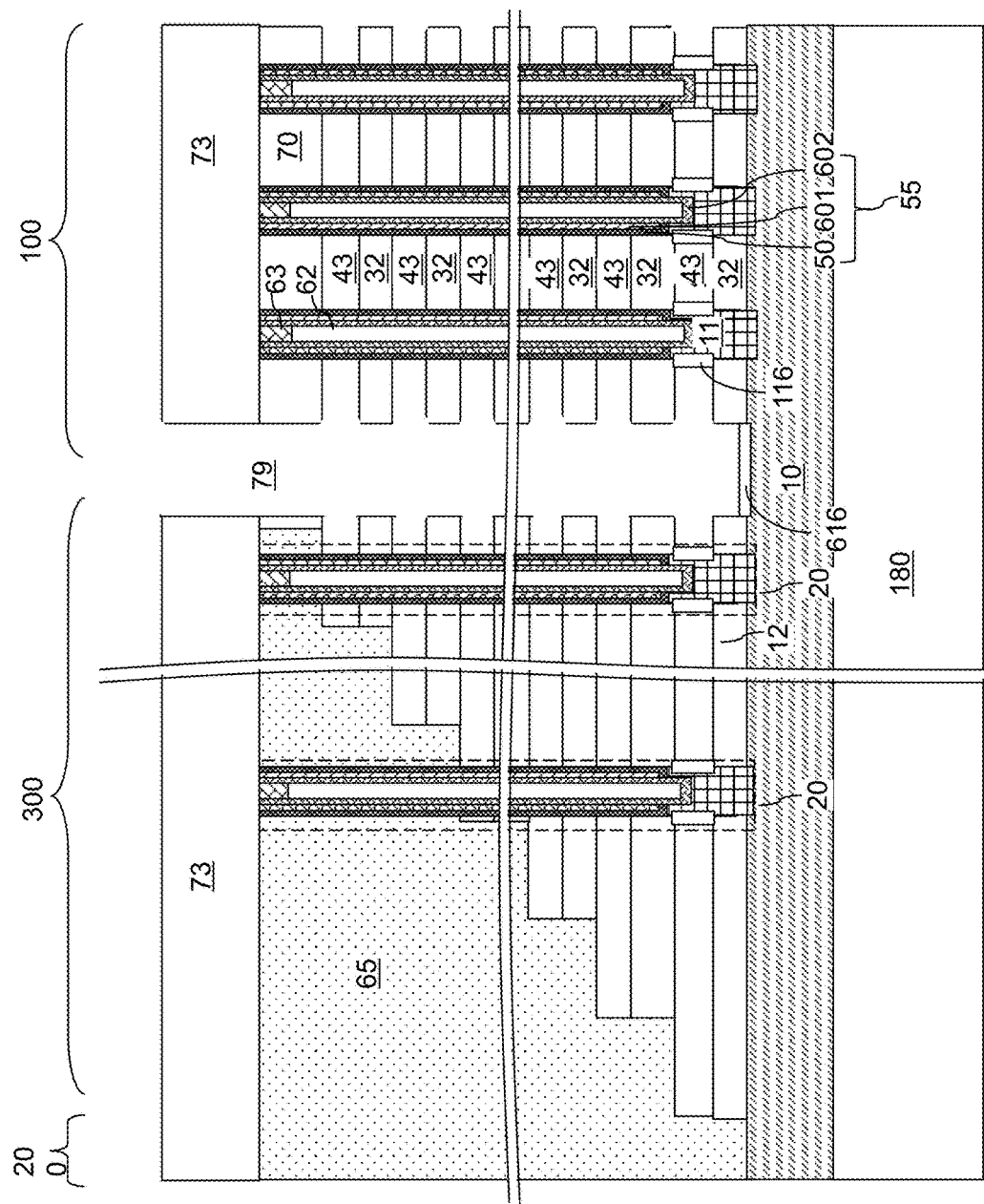
FIG. 11 is a schematic vertical cross-sectional view of the exemplary structure after formation of backside recesses according to an embodiment of the present disclosure.

Referring to FIG. 11, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the planar semiconductor layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the semiconductor substrate 410. In this case, each backside recess 43 can define a space for receiving a respective word line of the array of monolithic three-dimensional NAND strings.

Each of the plurality of backside recesses 43 can extend substantially parallel to the top surface of the semiconductor substrate 410. A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the planar semiconductor layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the planar semiconductor layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the planar semiconductor layer 10.

Figure 12:
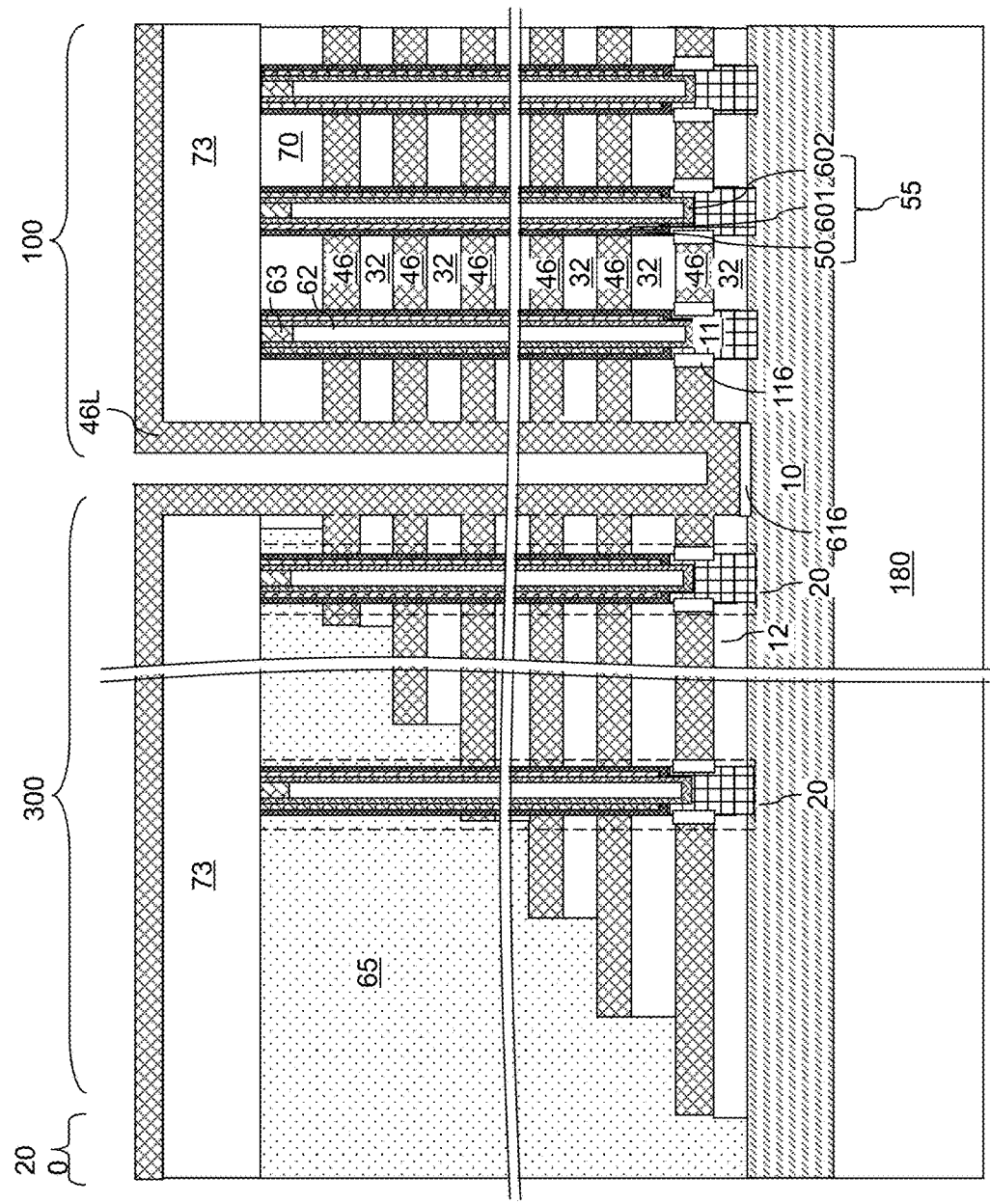
FIG. 12 is a schematic vertical cross-sectional view of the exemplary structure after formation of electrically conductive layers according to an embodiment of the present disclosure.

Referring to FIG. 12, a backside blocking dielectric layer (not expressly shown) can be optionally formed. The backside blocking dielectric layer, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

At least one metallic material can be deposited in the backside recesses 43. The at least one metallic material can include, for example, a metallic barrier layer and a metal fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer and a continuous portion of the metallic fill material layer that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 13:
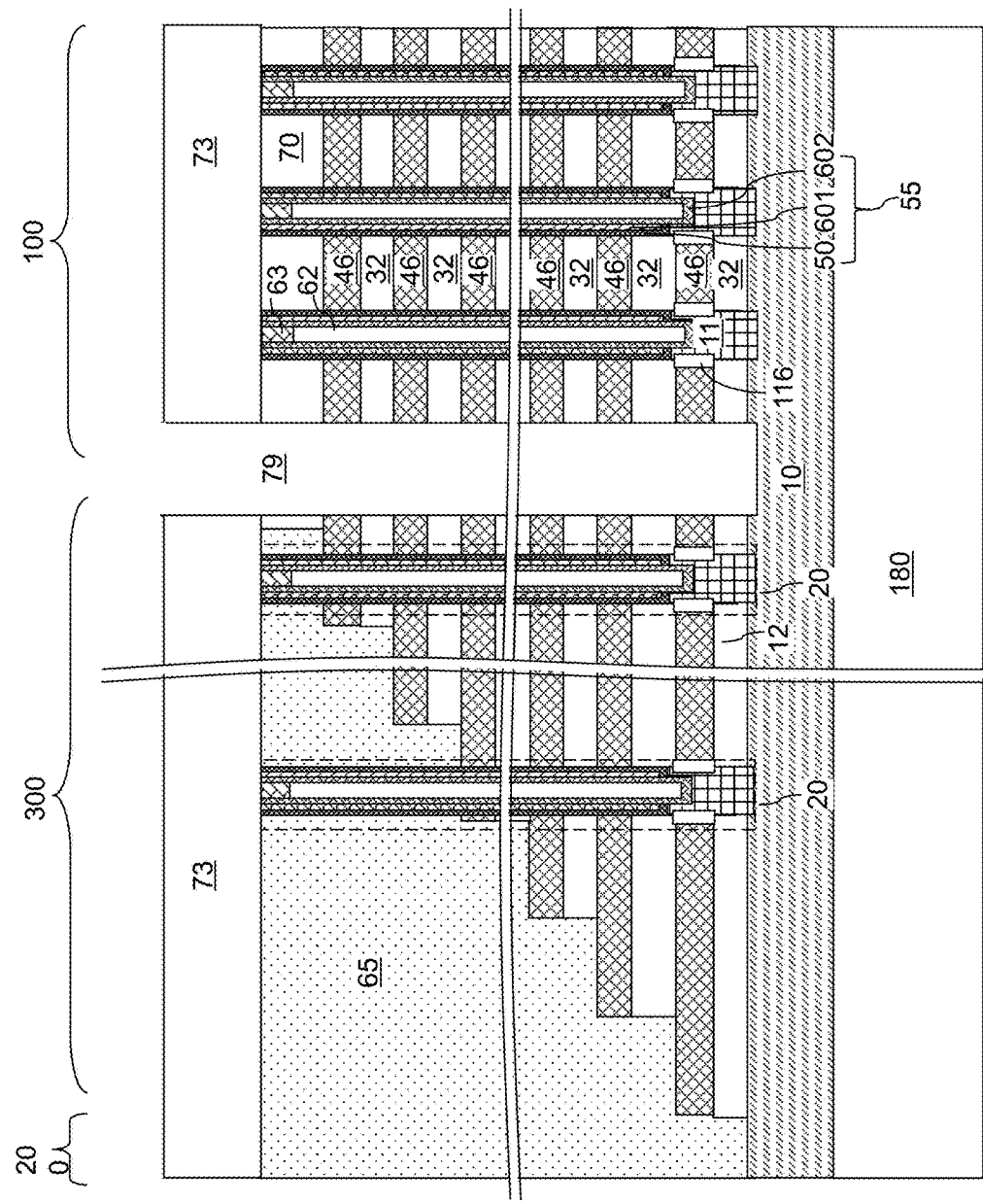
FIG. 13 is a schematic vertical cross-sectional view of the exemplary structure after removal of a deposited conductive material from within the backside trench according to an embodiment of the present disclosure.

Referring to FIG. 13, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 14:
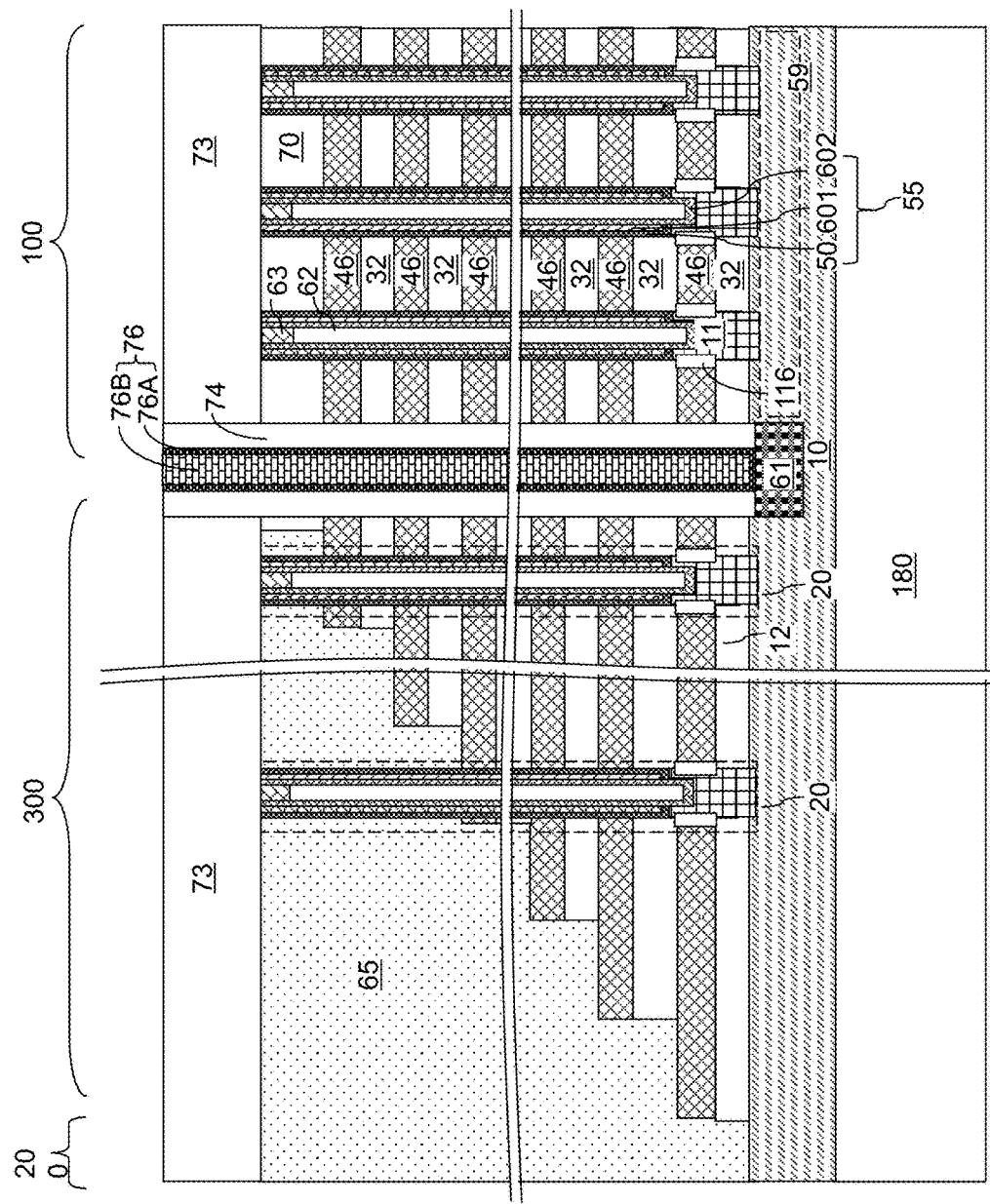
FIG. 14 is a schematic vertical cross-sectional view of the exemplary structure after formation of an insulating spacer and a backside contact structure according to an embodiment of the present disclosure.

Referring to FIG. 14, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer is present, the insulating material layer can be formed directly on surfaces of the backside blocking dielectric layer and directly on the sidewalls of the electrically conductive layers 46. If a backside blocking dielectric layer is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74.

The anisotropic etch process can continue with, or without, a change in the etch chemistry to remove portions of the optional backside blocking dielectric layer and the planar dielectric portion 616 that underlies the opening through the insulating spacer 74. An opening is formed though the planar dielectric portion 616 underneath each backside cavity, thereby vertically extending the backside cavity. A top surface of the planar semiconductor layer 10 can be physically exposed at the bottom of each backside trench 79. The remaining portion of each planar dielectric portion 616 is herein referred to as an annular dielectric portion 616', which can include a dielectric oxide of the semiconductor material of the planar semiconductor layer 10, have a uniform thickness, and an opening therethrough.

A source region 61 can be formed at a surface portion of the planar semiconductor layer 10 under each backside cavity by implantation of electrical dopants into physically exposed surface portions of the planar semiconductor layer 10. Each source region 61 is formed in a surface portion of the planar semiconductor layer 10 that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the planar semiconductor layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer is employed, the backside contact via structure 76 can contact a sidewall of the backside blocking dielectric layer.

Figure 15A:
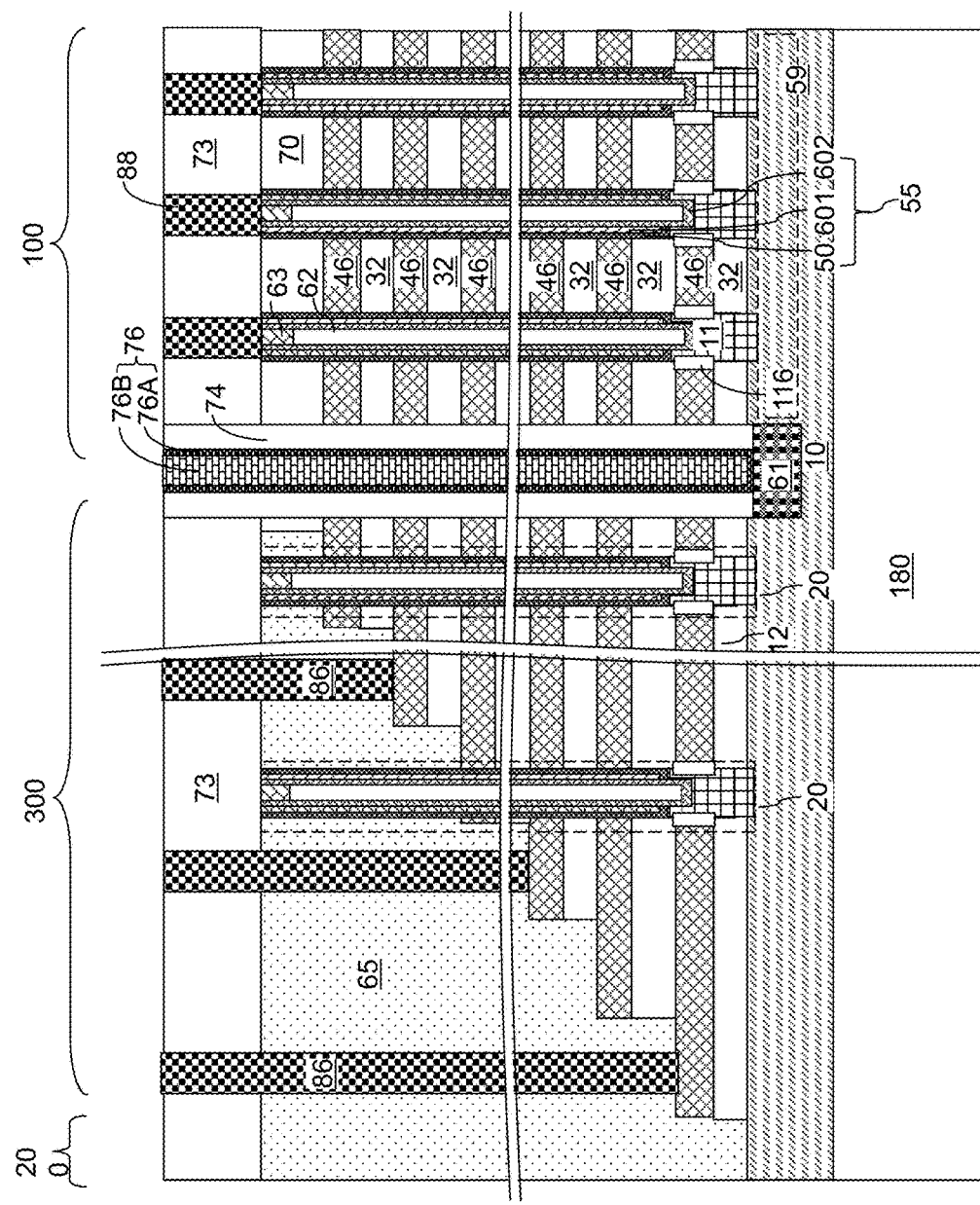
FIG. 15A is a schematic vertical cross-sectional view of the exemplary structure after formation of additional contact via structures according to an embodiment of the present disclosure.
Figure 15B:
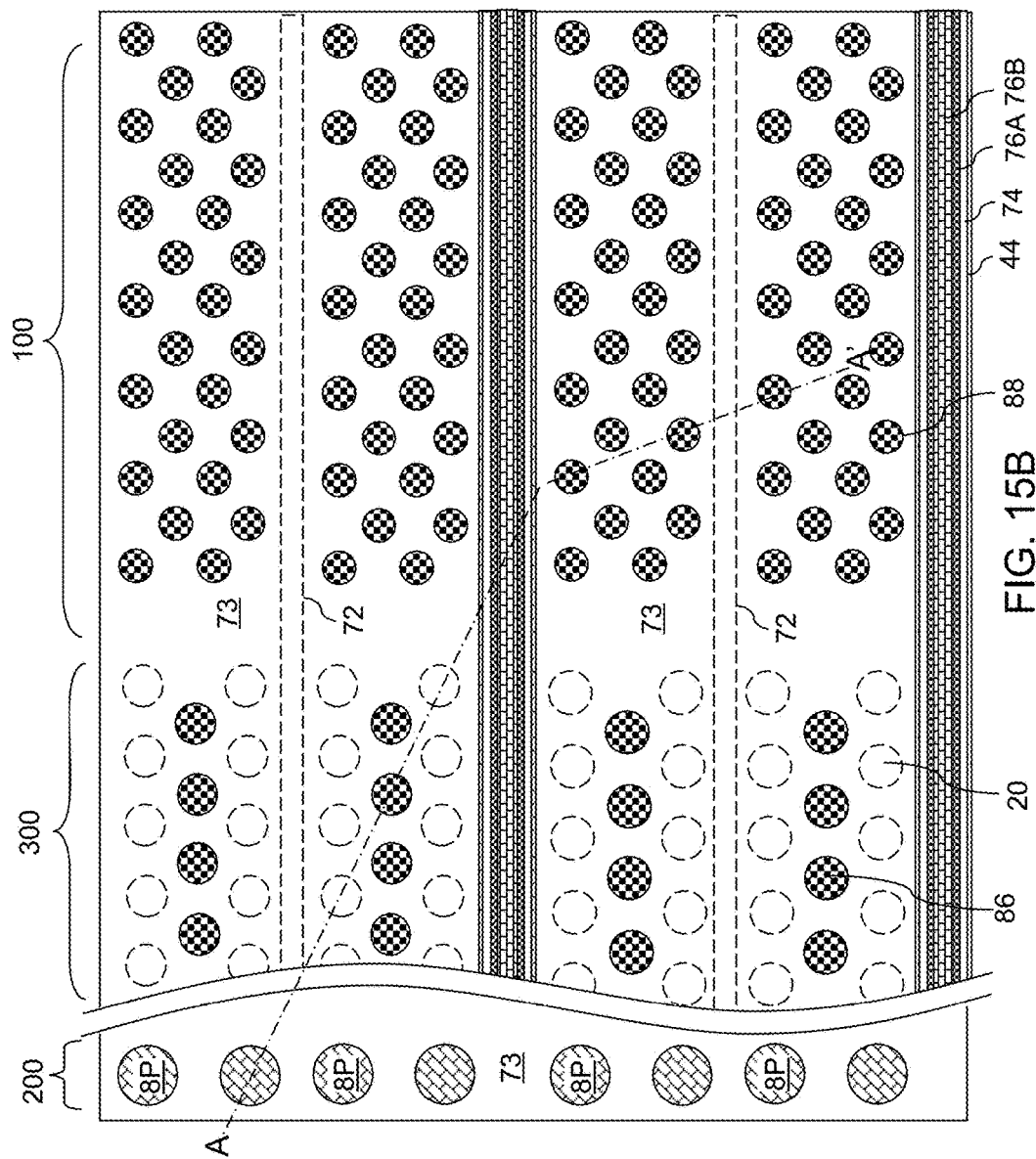
FIG. 15B is a top-down view of the exemplary structure of FIG. 15A. The vertical plane A-A' is the plane of the schematic vertical cross-sectional view of FIG. 15A.
Figure 15C:
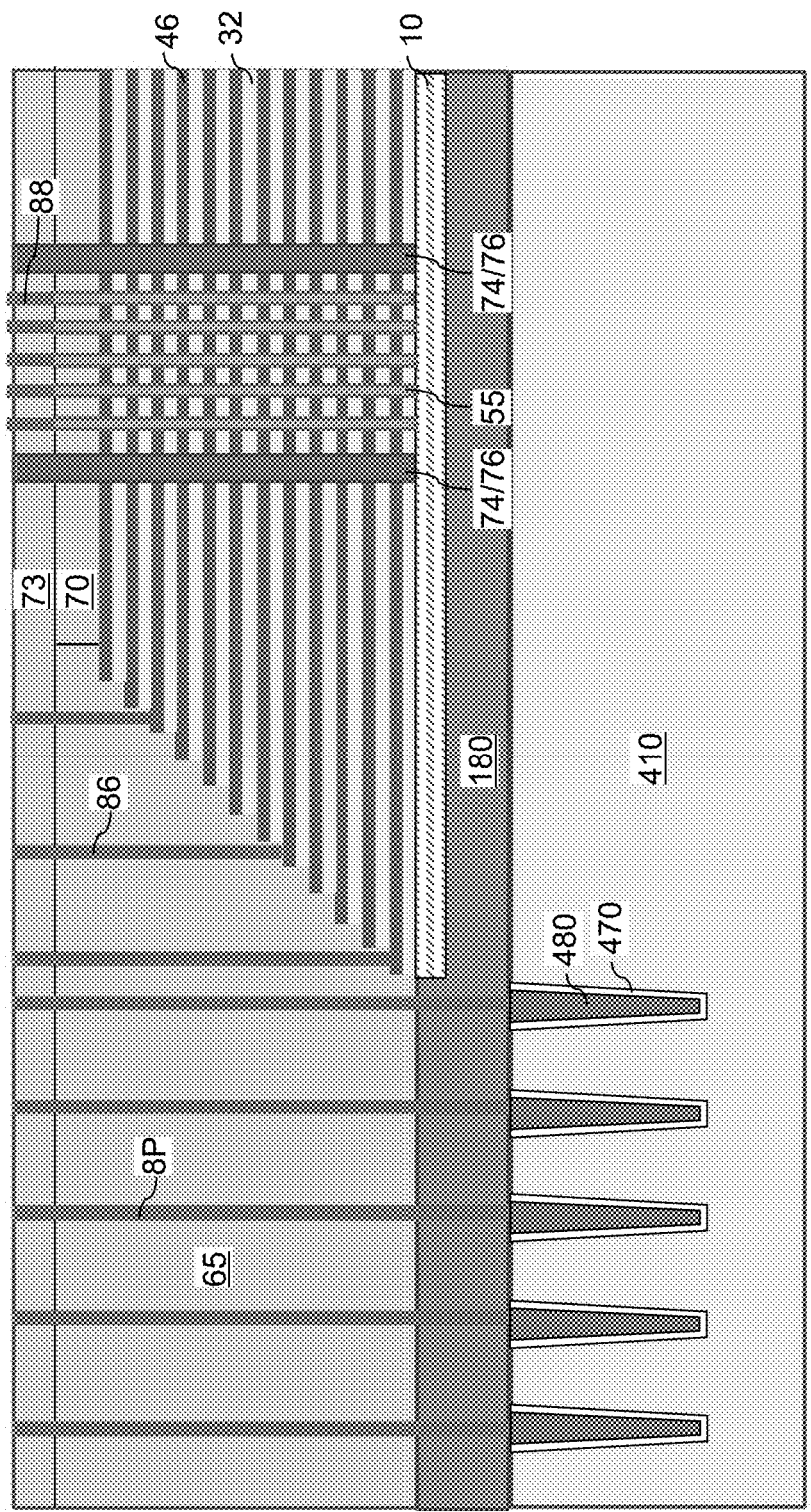
FIG. 15C is another schematic vertical cross-sectional view of the exemplary structure of FIGS. 15A and 15B.

Referring to FIGS. 15A-15C, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. As shown in FIG. 15C, through-dielectric via structures 8P can be formed through the contact level dielectric layer 73, the retro-stepped dielectric material portion 65, and the dielectric spacer material layer 180, and directly on a top surface of respective one of the through-substrate via structures 480. Each vertical stack of a through-dielectric via structure 8P and a through-substrate via structure 480 provides a vertical electrically conductive path that is subsequently employed to connect nodes of the memory devices containing the memory stack structures 55, such as word lines, source line and/or bit lines, and semiconductor devices to be subsequently formed on the backside surface of the semiconductor substrate 410.

Figure 16:
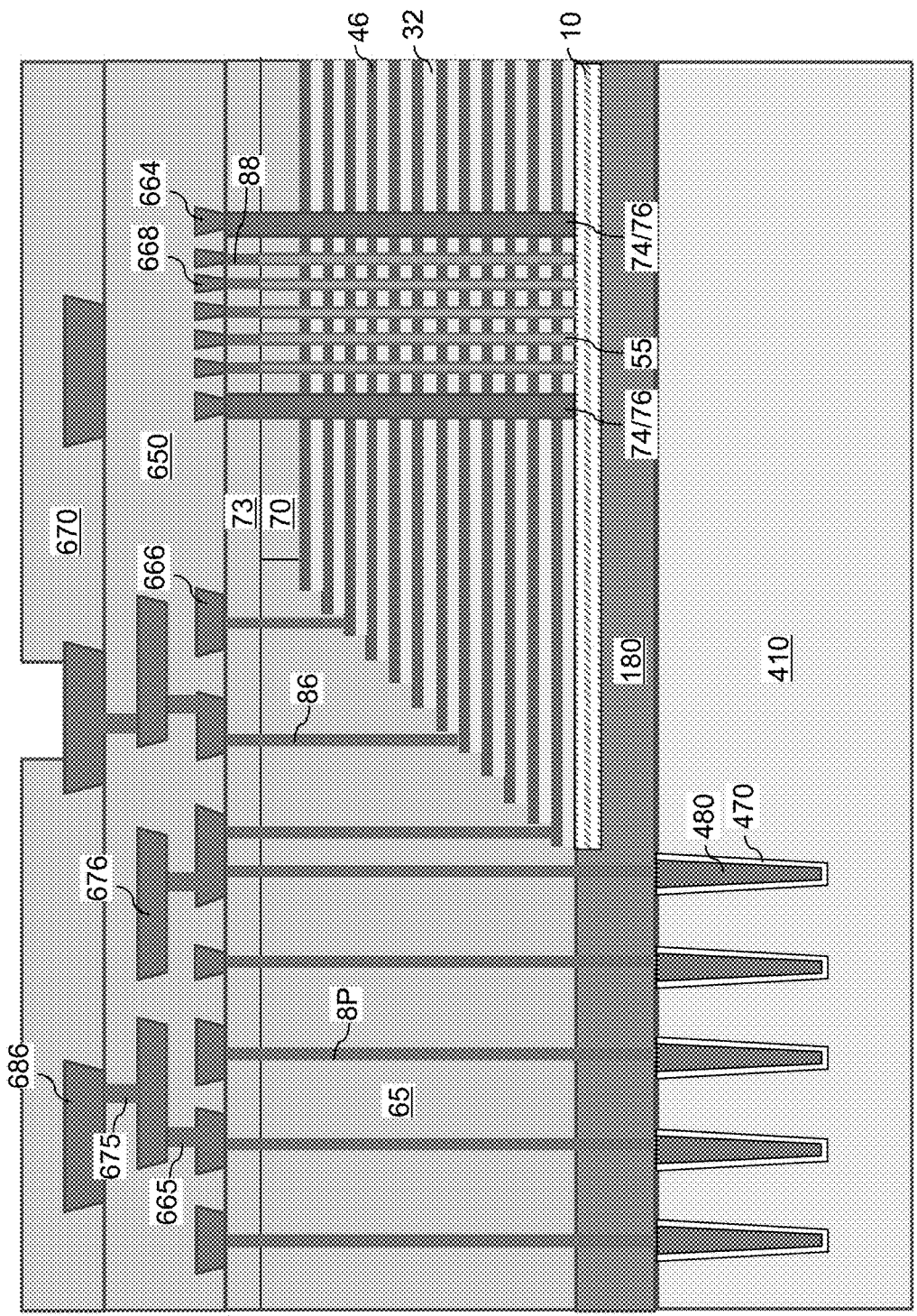
FIG. 16 is a vertical cross-sectional view of the exemplary structure after formation of front side dielectric layers and front side metal interconnect structures according to an embodiment of the present disclosure.

Referring to FIG. 16, front side dielectric layers (650, 670) and front side metal interconnect structures (664, 666, 668, 665, 675, 676, 686) can be subsequently formed over the alternating stack of the insulating layers 32 and the electrically conductive layers 46, the retro-stepped dielectric material portion 65, and the contact level dielectric layer 73. The front side dielectric layers (650, 670) can include line and via level dielectric material layer 650, which can include at least one front side line level dielectric layer and at least one front side via level dielectric layer. Further, the front side dielectric layers (650, 670) can include a topmost interconnect level dielectric layer 670. Each of the front side dielectric layers (650, 670) includes a respective dielectric material such as silicon oxide, silicon nitride, silicon oxynitride, a dielectric metal oxide, organosilicate glass, or combinations thereof.

The front side metal interconnect structures (664, 666, 668, 665, 675, 676, 686) can include backside bias lines 664 (which may be source bias lines) contacting the backside contact via structures 76, bit lines 668 contacting a respective subset of the drain contact via structures 88, and first line level interconnect structures 666, which can be metal lines. One subset of the first line level interconnect structures 666 (which can be metal line structures) can directly contact a top surface of a respective one of the through-dielectric via structures 8P. Another subset of the first line level interconnect structures 666 can contact a top surface of a respective one of the word line contact via structures 86. One or more of the electrically conductive layers 46 can be electrically shorted to a respective one of the through-dielectric via structures 8P through the word line contact via structures 86 and the first line level interconnect structures. The front side metal interconnect structures (664, 666, 668, 665, 675, 676, 686) can also include topmost interconnect structures 686.

The front side metal interconnect structures (664, 666, 668, 665, 675, 676, 686) can further include a first via level interconnect structures 665 (which can be metal via structures) that contact a respective one of the first line level interconnect structures 666; a second line level interconnect structures 676 (which can be metal line structures) that contact a respective one of the first via level interconnect structures 665; and a second via level interconnect structures 675 (which can be metal via structures) that contact a respective one of the second line level interconnect structures 676. The front side metal interconnect structures (664, 666, 668, 665, 675, 676, 686) can include additional line level interconnect structures (not shown) and/or additional via level interconnect structures (not shown).

In one embodiment, the topmost interconnect structures 686 can have shapes of metal pads for forming solder structures (such as C4 spheres) thereupon. At least one opening can be formed through the topmost interconnect level dielectric layer 670 to physically expose portions of the top surfaces of the topmost interconnect structures 686. The front side metal interconnect structures (664, 666, 668, 665, 675, 676, 686) are embedded within the front side dielectric material layers (650, 670).

Figure 17:
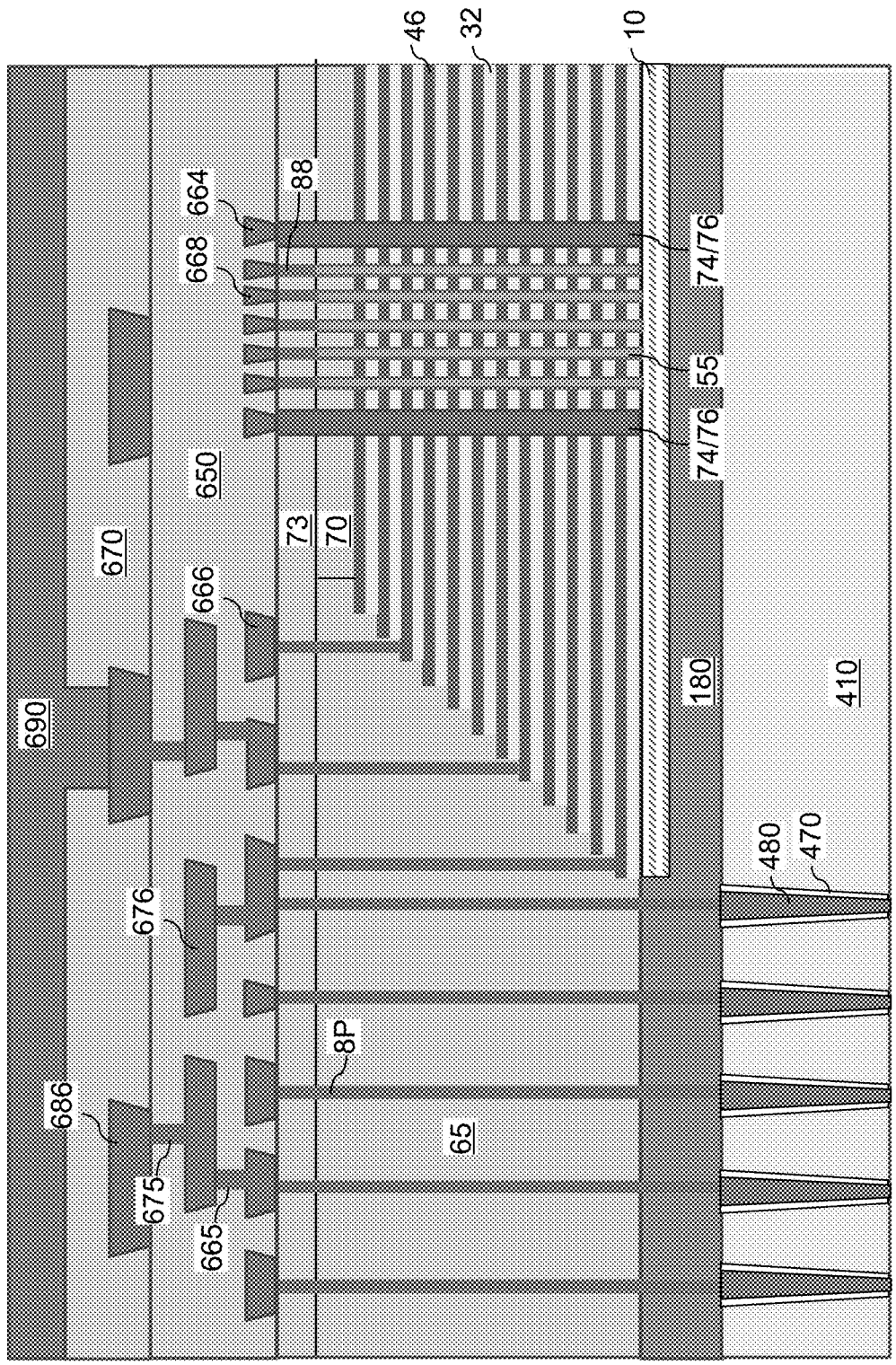
FIG. 17 is a vertical cross-sectional view of the exemplary structure after formation of a passivation layer according to an embodiment of the present disclosure.

Referring to FIG. 17, a passivation layer 690 can be formed over the topmost interconnect level dielectric layer 670. The passivation layer 690 can include a sacrificial material that can protect the topmost interconnect level dielectric layer 670 during subsequent processing, in which the exemplary structure is flipped upside down and placed on various surfaces for further processing. The passivation layer 690 can include silicon nitride, a dielectric metal oxide, or a polymer material. In one embodiment, the passivation layer 690 can include silicon nitride having a thickness in a range from 100 nm to 500 nm.

Figure 18:
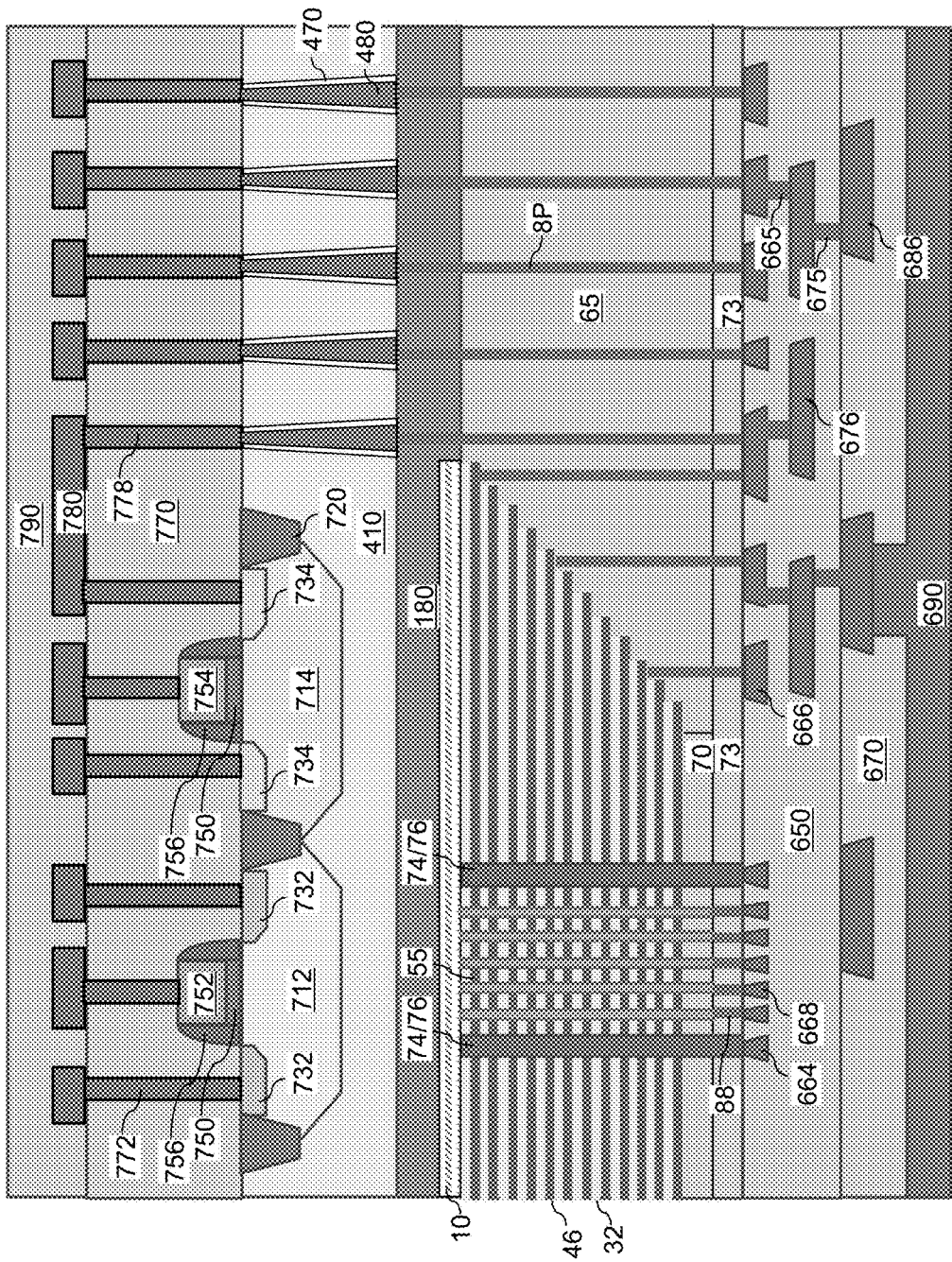
FIG. 18 is a vertical cross-sectional view of the exemplary structure after formation of semiconductor devices including a driver circuitry for the memory stack structures on a backside surface of the semiconductor substrate, backside dielectric material layers, and backside metal interconnect structures according to an embodiment of the present disclosure.

Referring to FIG. 18, the semiconductor substrate 410 is thinned to remove a bottom portion thereof. The thinning of the semiconductor substrate 410 can be performed by grinding, polishing, a wet etch, or a combination thereof. The thinning of the semiconductor substrate 410 can proceed at least until the bottom surfaces of the insulating liners 470 are removed, and metallic bottom surfaces of the through-substrate via structures 480 are physically exposed. The thickness of the semiconductor substrate 410 after thinning can be substantially the same as, or can be less than, the height of the through-substrate via structures 480. In one embodiment, the thickness of the thinned semiconductor substrate 410 may be in a range from 20 microns to 400 microns, from 30 microns to 200 microns, and/or from 50 microns to 100 microns, although lesser and greater depths can also be employed.

The exemplary structure can be flipped upside down so that additional processing steps can be performed on the backside surface of the semiconductor substrate 410, after thinning of the semiconductor substrate 410. For example, photoresist layers (not shown) can be applied and ion implantation steps can be performed to form various doped semiconductor wells (712, 714), which can include p-doped semiconductor wells 712 and n-doped semiconductor wells 714. Surface portions of the semiconductor substrate 410 can be implanted with electrical dopants through the backside surface of the semiconductor substrate 410.

Shallow trench isolation structures 720 can be formed by forming shallow trenches by a combination of lithographic patterning and anisotropic etching of physically exposed surface portions underneath the backside surface of the semiconductor substrate 410. Gate dielectrics 750, gate electrodes (752, 754), and gate sidewall spacers 756 can be subsequently formed. The gate electrodes (752, 754) can include first gate electrodes 752 providing a first work function for n-type field effect transistors formed over a respective p-doped semiconductor well 712, and second gate electrodes 754 providing a second work function for p-type field effect transistors formed over a respective n-doped semiconductor well 714. N-doped active regions 732 (such as source regions and drain regions) can be formed for npn field effect transistors, and p-doped active regions 734 can be formed for pnp field effect transistors. Each of the field effect transistors can include a respective channel that is a surface portion of the semiconductor substrate 410 and a respective gate electrode (752, 754) that is vertically spaced from the semiconductor substrate 410 by a respective gate dielectric 750. Additional semiconductor devices such as diodes, capacitors, resistors, and inductors may be formed on the backside surface of the semiconductor substrate 410.

Backside dielectric material layers (770, 790) can be formed over the backside surface of the semiconductor substrate 410 and the semiconductor devices thereupon. The backside dielectric material layers (770, 790) can include backside interconnect level dielectric material layers 770 and a backside capping dielectric layer 790. Backside metal interconnect structures (772, 778, 780) can be embedded in the backside dielectric material layers (770, 790). The backside metal interconnect structures (772, 778, 780) can include source and drain electrodes 772 of the driver circuitry transistors, backside via structures 778 and backside line structures 780. A subset of the backside via structures 778 can be formed directly on various nodes of the semiconductor devices on the backside surface of the semiconductor substrate 410. The backside line structures 780 can provide lateral electrical connection among source and drain electrodes 772 and the backside via structures 778.

A subset of the backside via structures 778 can be formed directly on a respective one of the through-substrate via structures 480 can be formed with a finite taper angle such that a top surface of each through-substrate via structures 480 has a greater surface area than a bottom surface of each through-substrate via structures 480. In this case, each through-substrate via structure 480 can be formed with a first horizontal surface having a greater area, and a second horizontal surface having a lesser area. In one embodiment, the first horizontal surface of a through-substrate via structure 480 can contact a respective one of the through-dielectric via structure 8P, and the second horizontal surface of the through-substrate via structure 480 can contact a respective one of the backside via structures 778. If additional backside via structures (not shown) and/or additional backside line structures are provided above the level of the backside via structures 778 that contact the various nodes of the semiconductor devices, such additional backside via structures and backside line structures can provide electrically conductive paths between the various nodes of the semiconductor devices on the backside surface of the semiconductor substrate 410 and the through-substrate via structures 480 within the levels of the backside dielectric material layers (770, 790). The backside capping dielectric layer 790 can provide electrical isolation of the backside metal interconnect structures (778, 780) from the environment.

In one embodiment, the semiconductor devices that are formed on the backside surface of the thinned semiconductor substrate 410 can include a driver circuitry for the memory stack structures 55, the electrically conductive layers 46 that comprises the word lines for the memory stack structures 55, the bit lines 668 that are electrically shorted to a respective set of drain regions 63, and/or the backside bias lines 664 (which may be source bias lines). The driver circuitry can include field effect transistors.

Electrically conductive paths electrically connect nodes of the driver circuitry to respective nodes of the memory stack structures 55, the electrically conductive layers 46, the bit lines 668, and/or the backside bias lines 664. In one embodiment, each of the electrically conductive paths can comprise a respective one of the through-substrate via structures 480. In addition, at least a subset of the electrically conductive paths can comprise a respective subset of the backside metal interconnect structures (778, 780) and a respective subset of the front side metal interconnect structures (664, 666, 668, 665, 675, 676, 686).

Figure 19:
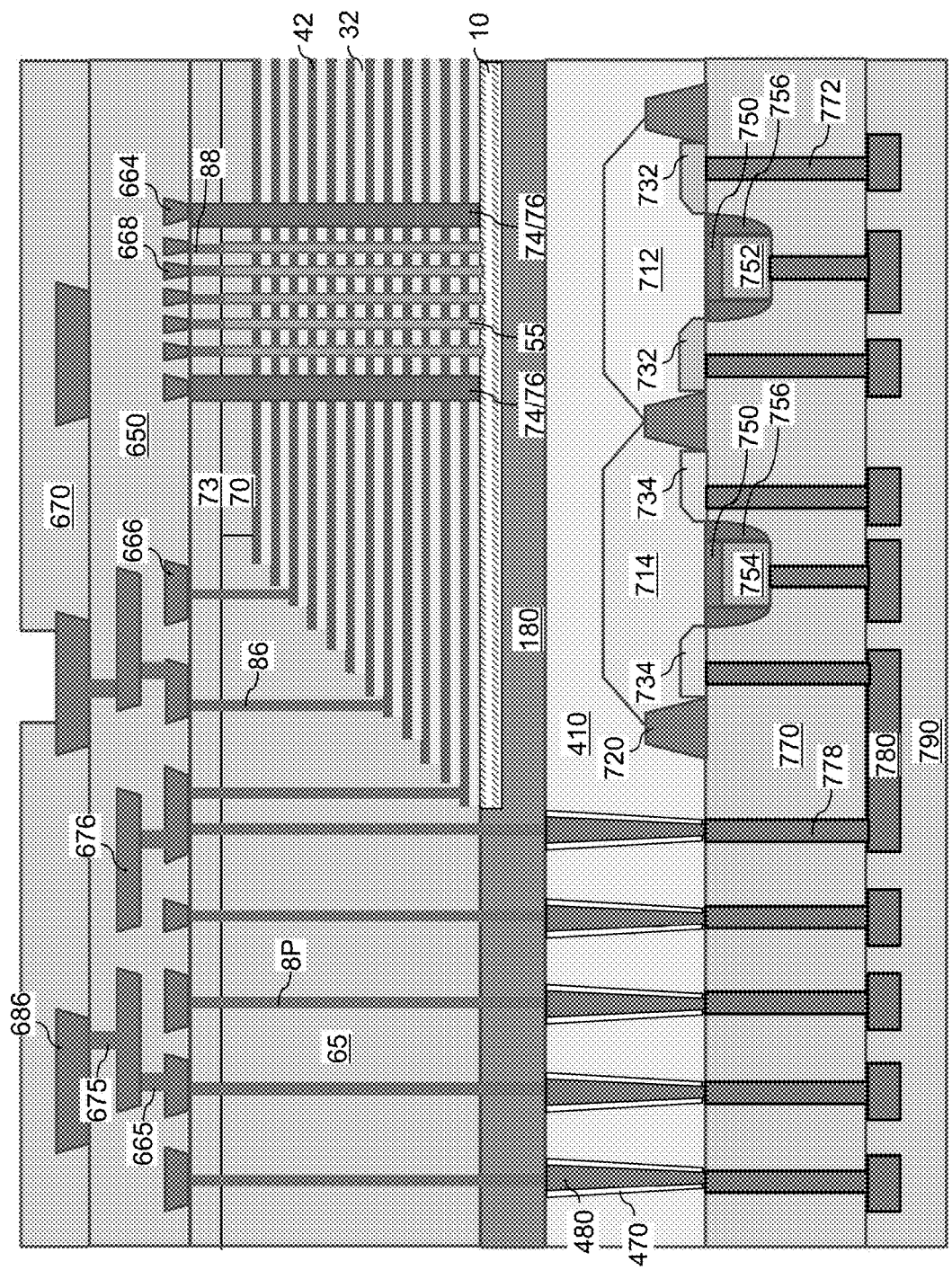
FIG. 19 is a vertical cross-sectional view of the exemplary structure after removal of the passivation layer according to an embodiment of the present disclosure.

Referring to FIG. 19, the exemplary structure can be flipped upside down again, and the passivation layer 690 can be removed selective to the topmost interconnect level dielectric layer 670 and the topmost interconnect structures 686. The exemplary structure can be diced and packaged as known in the art. By forming the peripheral transistors of the driver circuitry on the backside of the semiconductor substrate 410, diffusion of hydrogen from the alternating stack to the peripheral transistors can be reduced or avoided. Furthermore, a higher thermal budget can be used to form the device without increasing the hydrogen diffusion into the peripheral transistors on the backside of the semiconductor substrate.

According to an aspect of the present disclosure, a three-dimensional memory device is provided, which comprises: an alternating stack of insulating layers 32 and electrically conductive word lines 46 located over a front side surface of a semiconductor substrate 410; memory stack structures 55 extending through the alternating stack (32, 46), wherein each of the memory stack structures 55 comprises a memory film 50 and a vertical semiconductor channel 60 contacting an inner sidewall of the memory film 50; drain regions 63 contacting a respective vertical semiconductor channel 60; bit lines 668 electrically connected to the respective drain regions 63; driver circuitry for the memory stack structures 55 located on a backside of the semiconductor substrate 410; and electrically conductive paths vertically extending through the semiconductor substrate and electrically connecting nodes of the driver circuitry to respective word lines 46 or bit lines 668.

In one embodiment, the driver circuitry comprises field effect transistors, and each of the field effect transistors includes a respective channel that is includes a portion of the backside surface of the semiconductor substrate 410 and a respective gate electrode (752, 754) that is located below the backside surface of the semiconductor substrate 410. In one embodiment, the three-dimensional memory can further comprise doped semiconductor wells (712, 714) located on, and above, the backside surface of the semiconductor surface 410 and vertically spaced from the front side surface of the semiconductor substrate 410.

In one embodiment, the three-dimensional memory device can further comprise: front side dielectric material layers (650, 670) overlying the alternating stack (32, 46) and the memory stack structures 55; front side metal interconnect structures (664, 666, 668, 665, 675, 676, 686) embedded within the front side dielectric material layers (650, 670); and backside dielectric material layers (770, 790) underlying the driver circuitry; and backside metal interconnect structures (778, 780) embedded within the backside dielectric material layers (770, 790). In one embodiment, at least one of the electrically conductive paths comprises a respective subset of the front side metal interconnect structures (664, 666, 668, 665, 675, 676, 686) and a respective subset of the backside metal interconnect structures (778, 780).

In one embodiment, each of the electrically conductive paths comprises a respective through-substrate via structure 480 that vertically extends through the semiconductor substrate 410 from its front surface to its backside surface. In one embodiment, each of the through-substrate via structures 480 has a taper such that a horizontal cross-sectional shape has a greater area in proximity to the front side surface of the semiconductor substrate 410 than in proximity to the backside surface of the semiconductor substrate 410. In one embodiment, each of the through-substrate via structure 480 can be electrically insulated from the semiconductor substrate 410 by a respective insulating liner 470.

In one embodiment, the alternating stack (32, 46) includes a stepped surface region in which a lateral extent of the electrically conductive layers 46 decreases with a vertical distance from the front side surface of the semiconductor substrate 410 to form stepped surfaces. A retro-stepped dielectric material portion 65 can be located on the stepped surfaces and over the semiconductor substrate 410. In one embodiment, each of the through-substrate via structures 480 can contact a through-dielectric via structure 8P. The through-dielectric via structure 8P can extend through the retro-stepped dielectric material portion 65 and can contact a respective front side metal interconnect structure 666 that overlies the retro-stepped dielectric material portion 65.

In one embodiment, the semiconductor substrate 410 comprises a single crystalline silicon wafer. In one embodiment, the three-dimensional memory device can further comprise a planar semiconductor material layer 10 overlying the front side of the semiconductor substrate 410 and underlying the alternating stack (32, 46) and electrically shorted to bottom ends of the vertical semiconductor channels 60 of the memory stack structures 55. In one embodiment, the three-dimensional memory device can further comprise a dielectric spacer material layer 180 overlying the front side of the semiconductor substrate 410 and underlying the planar semiconductor material layer 10 and electrically isolating the planar semiconductor material layer 10 from the semiconductor substrate 410.

In one embodiment, the three-dimensional memory device comprises a monolithic three-dimensional NAND memory device. The semiconductor substrate 410 can comprise a silicon substrate. The monolithic three-dimensional NAND memory device can comprise an array of monolithic three-dimensional NAND strings over the silicon substrate.

At least one memory cell (as embodied as a portion of a charge storage layer 54 at a level of an electrically conductive word line 46) in a first device level of the array of monolithic three-dimensional NAND strings can be located over another memory cell (as embodied as another portion of the charge storage layer 54 at a level of another electrically conductive word line 46) in a second device level of the array of monolithic three-dimensional NAND strings. The electrically conductive word lines 46 can have a strip shape extending substantially parallel to the front side surface of the semiconductor substrate 410, e.g., between a pair of backside trenches 79. The plurality of control gate electrodes comprises at least a first control gate electrode located in a first device level and a second control gate electrode located in a second device level.

The array of monolithic three-dimensional NAND strings can comprise: a plurality of semiconductor channels (59, 11, 60) located including a respective one of the vertical semiconductor channels 60, and a plurality of charge storage elements (as embodied as charge trapping material portions). Each charge storage element can be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and word lines located over a front side surface of a semiconductor substrate;
memory stack structures extending through the alternating stack, wherein each of the memory stack structures comprises a memory film and a vertical semiconductor channel contacting an inner sidewall of the memory film;
drain regions contacting a respective vertical semiconductor channel;
bit lines electrically connected to the respective drain regions;
driver circuitry for the memory stack structures located on a backside of the semiconductor substrate; and
electrically conductive paths vertically extending through the semiconductor substrate and electrically connecting nodes of the driver circuitry to respective word lines or bit lines.

2. The three-dimensional memory device of claim 1, wherein:
the driver circuitry comprises field effect transistors; and
each of the field effect transistors includes a respective channel that includes a portion of a backside surface of the semiconductor substrate and a respective gate electrode that is located below the backside surface of the semiconductor substrate.

3. The three-dimensional memory device of claim 2, further comprising doped semiconductor wells located on, and above, the backside surface of the semiconductor surface and vertically spaced from the front side surface of the semiconductor substrate.

4. The three-dimensional memory device of claim 1, further comprising:
front side dielectric material layers overlying the alternating stack and the memory stack structures;
front side metal interconnect structures embedded within the front side dielectric material layers; and
backside dielectric material layers underlying the driver circuitry; and
backside metal interconnect structures embedded within the backside dielectric material layers,
wherein at least one of the electrically conductive paths comprises a respective subset of the front side metal interconnect structures and a respective subset of the backside metal interconnect structures.

5. The three-dimensional memory device of claim 1, wherein each of the electrically conductive paths comprises a respective through-substrate via structure that vertically extends through the semiconductor substrate from a front side surface of the semiconductor substrate to a backside surface of the semiconductor substrate.

6. The three-dimensional memory device of claim 5, wherein each of the through-substrate via structures has a taper such that a horizontal cross-sectional shape has a greater area in proximity to the front side surface of the semiconductor substrate than in proximity to the backside surface of the semiconductor substrate.

7. The three-dimensional memory device of claim 5, wherein:
the alternating stack includes a stepped surface region in which a lateral extent of the word lines decreases with a vertical distance from the front side surface of the semiconductor substrate to form stepped surfaces; and
a retro-stepped dielectric material portion is located on the stepped surfaces and over the semiconductor substrate.

8. The three-dimensional memory device of claim 7, wherein each of the through-substrate via structures contacts a through-dielectric via structure that extends through the retro-stepped dielectric material portion and contacts a respective front side metal interconnect structure that overlies the retro-stepped dielectric material portion.

9. The three-dimensional memory device of claim 1, wherein the semiconductor substrate comprises a single crystalline silicon wafer.

10. The three-dimensional memory device of claim 1, further comprising a planar semiconductor material layer overlying the front side of the semiconductor substrate and underlying the alternating stack and electrically shorted to bottom ends of the vertical semiconductor channels of the memory stack structures.

11. The three-dimensional memory device of claim 10, further comprising a dielectric spacer material layer overlying the front side of the semiconductor substrate and underlying the planar semiconductor material layer and electrically isolating the planar semiconductor material layer from the semiconductor substrate.

12. The three-dimensional memory device of claim 1, wherein:
the three-dimensional memory device comprises a monolithic three-dimensional NAND memory device;
the semiconductor substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the word lines have a strip shape extending substantially parallel to the front side surface of the semiconductor substrate; and
the array of monolithic three-dimensional NAND strings comprises:
a plurality of semiconductor channels located including a respective one of the vertical semiconductor channels, and a plurality of charge storage elements embodied as portions of the memory films, each charge storage element located adjacent to a respective one of the vertical semiconductor channels.

* * * * *